United States Patent
Kim et al.

(10) Patent No.: US 12,334,953 B2
(45) Date of Patent: Jun. 17, 2025

(54) MEMORY CONTROLLERS AND MEMORY SYSTEMS INCLUDING THE SAME

(71) Applicant: Samsung Electronics Co., Ltd., Suwon-si (KR)

(72) Inventors: Jiho Kim, Suwon-si (KR); Seongmuk Kang, Suwon-si (KR); Daehyun Kim, Suwon-si (KR); Kijun Lee, Suwon-si (KR); Myungkyu Lee, Suwon-si (KR); Kyomin Sohn, Suwon-si (KR); Sunghye Cho, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/339,490

(22) Filed: Jun. 22, 2023

(65) Prior Publication Data

US 2024/0178861 A1    May 30, 2024

(30) Foreign Application Priority Data

Nov. 29, 2022    (KR) .................. 10-2022-0162247

(51) Int. Cl.
*H03M 13/11*    (2006.01)
*H03M 13/00*    (2006.01)

(52) U.S. Cl.
CPC ...... *H03M 13/1111* (2013.01); *H03M 13/611* (2013.01)

(58) Field of Classification Search
CPC .................. H03M 13/1111; H03M 13/611
See application file for complete search history.

(56) References Cited

U.S. PATENT DOCUMENTS

| | | | |
|---|---|---|---|
| 4,646,301 A * | 2/1987 | Okamoto | H03M 13/29 |
| 8,250,435 B2 | 8/2012 | Blankenship et al. | |
| 8,935,592 B2 | 1/2015 | Campbell et al. | |
| 9,691,505 B2 | 6/2017 | Das et al. | |
| 10,922,171 B2 | 2/2021 | Cho et al. | |
| 10,957,411 B2 | 3/2021 | Lee | |
| 11,108,412 B2 | 8/2021 | Shin et al. | |
| 11,301,320 B2 | 4/2022 | Fackenthal et al. | |
| 11,755,209 B2 | 9/2023 | Kasai et al. | |
| 11,953,988 B2 | 4/2024 | Schaefer et al. | |
| 2010/0287447 A1 | 11/2010 | Kong et al. | |

(Continued)

FOREIGN PATENT DOCUMENTS

TW    202238607 A    10/2022

*Primary Examiner* — Mark D Featherstone
*Assistant Examiner* — Jeffrey Andrew Yang
(74) *Attorney, Agent, or Firm* — Myers Bigel, P.A.

(57) ABSTRACT

A memory controller to control a memory module including a plurality of data chips, a first parity chip and a second parity chip, includes a system error correction code (ECC) engine and a processor to control the system ECC engine. The system ECC engine includes an ECC decoder and a memory to store a parity check matrix. The ECC decoder selects one of a plurality of ECC decoding schemes based on decoding status flags and corrects a plurality of symbol errors in a read codeword set from the memory module by performing an ECC decoding on the read codeword set based on the selected decoding scheme and the parity check matrix. The decoding status flags are provided from the plurality of data chips and each of the decoding status flags indicates whether at least one error bit is detected in respective one of the plurality of data chips.

20 Claims, 29 Drawing Sheets

(56) References Cited

U.S. PATENT DOCUMENTS

| | | | |
|---|---|---|---|
| 2012/0290899 A1* | 11/2012 | Cideciyan | G06F 11/1072 |
| | | | 714/E11.035 |
| 2019/0288707 A1* | 9/2019 | Kumar | G06F 3/0658 |
| 2019/0340067 A1* | 11/2019 | Kim | G06F 13/1668 |
| 2020/0034225 A1* | 1/2020 | Pawlowski | G11C 16/3431 |
| 2020/0082891 A1 | 3/2020 | Lee | |
| 2020/0133768 A1* | 4/2020 | Lee | G06F 11/1012 |
| 2020/0192754 A1 | 6/2020 | Cho et al. | |
| 2020/0328879 A1* | 10/2020 | Makaram | H04L 1/1812 |
| 2020/0371873 A1 | 11/2020 | Schaefer et al. | |
| 2021/0036720 A1* | 2/2021 | Shin | H03M 13/1585 |
| 2021/0083687 A1* | 3/2021 | Lee | H03M 13/116 |
| 2021/0194508 A1* | 6/2021 | Kim | G06F 11/1048 |
| 2022/0209794 A1 | 6/2022 | Palangappa et al. | |

* cited by examiner

FIG. 8

RSM11

| IM | $\alpha$ | $\alpha^2$ | $\alpha^3$ | $\alpha^4$ | $\alpha^5$ | $\alpha^6$ | $\alpha^7$ |
|---|---|---|---|---|---|---|---|
| IM | $\alpha^2$ | $\alpha^4$ | $\alpha^6$ | $\alpha^8$ | $\alpha^{10}$ | $\alpha^{12}$ | $\alpha^{14}$ |
| IM | $\alpha^3$ | $\alpha^6$ | $\alpha^9$ | $\alpha^{12}$ | $\alpha^{15}$ | $\alpha^{18}$ | $\alpha^{21}$ |
| IM | $\alpha^4$ | $\alpha^8$ | $\alpha^{12}$ | $\alpha^{16}$ | $\alpha^{20}$ | $\alpha^{24}$ | $\alpha^{28}$ |
| IM | $\alpha^5$ | $\alpha^{10}$ | $\alpha^{15}$ | $\alpha^{20}$ | $\alpha^{25}$ | $\alpha^{30}$ | $\alpha^{35}$ |
| IM | $\alpha^6$ | $\alpha^{12}$ | $\alpha^{18}$ | $\alpha^{24}$ | $\alpha^{30}$ | $\alpha^{36}$ | $\alpha^{42}$ |
| IM | $\alpha^7$ | $\alpha^{14}$ | $\alpha^{21}$ | $\alpha^{28}$ | $\alpha^{35}$ | $\alpha^{42}$ | $\alpha^{49}$ |
| IM | $\alpha^8$ | $\alpha^{16}$ | $\alpha^{24}$ | $\alpha^{32}$ | $\alpha^{40}$ | $\alpha^{48}$ | $\alpha^{56}$ |

RSM21

| IM | $\alpha^9$ | $\alpha^{18}$ | $\alpha^{27}$ | $\alpha^{36}$ | $\alpha^{45}$ | $\alpha^{54}$ | $\alpha^{63}$ |
|---|---|---|---|---|---|---|---|
| IM | $\alpha^{10}$ | $\alpha^{20}$ | $\alpha^{30}$ | $\alpha^{40}$ | $\alpha^{50}$ | $\alpha^{60}$ | $\alpha^{70}$ |
| IM | $\alpha^{11}$ | $\alpha^{22}$ | $\alpha^{33}$ | $\alpha^{44}$ | $\alpha^{55}$ | $\alpha^{66}$ | $\alpha^{77}$ |
| IM | $\alpha^{12}$ | $\alpha^{24}$ | $\alpha^{36}$ | $\alpha^{48}$ | $\alpha^{60}$ | $\alpha^{72}$ | $\alpha^{84}$ |
| IM | $\alpha^{13}$ | $\alpha^{26}$ | $\alpha^{39}$ | $\alpha^{52}$ | $\alpha^{65}$ | $\alpha^{78}$ | $\alpha^{91}$ |
| IM | $\alpha^{14}$ | $\alpha^{28}$ | $\alpha^{42}$ | $\alpha^{56}$ | $\alpha^{70}$ | $\alpha^{84}$ | $\alpha^{98}$ |
| IM | $\alpha^{15}$ | $\alpha^{30}$ | $\alpha^{45}$ | $\alpha^{60}$ | $\alpha^{75}$ | $\alpha^{90}$ | $\alpha^{105}$ |
| IM | $\alpha^{16}$ | $\alpha^{32}$ | $\alpha^{48}$ | $\alpha^{64}$ | $\alpha^{80}$ | $\alpha^{96}$ | $\alpha^{112}$ |

RSM(1k+1)

| $\alpha^{64}$ | $\alpha^{65}$ | $\alpha^{66}$ | $\alpha^{67}$ | $\alpha^{68}$ | $\alpha^{69}$ | $\alpha^{70}$ | $\alpha^{71}$ |
|---|---|---|---|---|---|---|---|
| $\alpha^{128}$ | $\alpha^{130}$ | $\alpha^{132}$ | $\alpha^{134}$ | $\alpha^{136}$ | $\alpha^{138}$ | $\alpha^{140}$ | $\alpha^{142}$ |
| $\alpha^{192}$ | $\alpha^{195}$ | $\alpha^{198}$ | $\alpha^{201}$ | $\alpha^{204}$ | $\alpha^{207}$ | $\alpha^{210}$ | $\alpha^{213}$ |
| $\alpha^{1}$ | $\alpha^{5}$ | $\alpha^{9}$ | $\alpha^{13}$ | $\alpha^{17}$ | $\alpha^{21}$ | $\alpha^{25}$ | $\alpha^{29}$ |
| $\alpha^{65}$ | $\alpha^{70}$ | $\alpha^{75}$ | $\alpha^{80}$ | $\alpha^{85}$ | $\alpha^{90}$ | $\alpha^{95}$ | $\alpha^{100}$ |
| $\alpha^{129}$ | $\alpha^{135}$ | $\alpha^{141}$ | $\alpha^{147}$ | $\alpha^{153}$ | $\alpha^{159}$ | $\alpha^{165}$ | $\alpha^{171}$ |
| $\alpha^{193}$ | $\alpha^{200}$ | $\alpha^{207}$ | $\alpha^{214}$ | $\alpha^{221}$ | $\alpha^{228}$ | $\alpha^{235}$ | $\alpha^{242}$ |
| $\alpha^{2}$ | $\alpha^{10}$ | $\alpha^{18}$ | $\alpha^{26}$ | $\alpha^{34}$ | $\alpha^{42}$ | $\alpha^{50}$ | $\alpha^{58}$ |

RSM(2k+1)

| $\alpha^{66}$ | $\alpha^{75}$ | $\alpha^{84}$ | $\alpha^{93}$ | $\alpha^{102}$ | $\alpha^{111}$ | $\alpha^{120}$ | $\alpha^{129}$ |
|---|---|---|---|---|---|---|---|
| $\alpha^{130}$ | $\alpha^{140}$ | $\alpha^{150}$ | $\alpha^{160}$ | $\alpha^{170}$ | $\alpha^{180}$ | $\alpha^{190}$ | $\alpha^{200}$ |
| $\alpha^{194}$ | $\alpha^{205}$ | $\alpha^{216}$ | $\alpha^{227}$ | $\alpha^{238}$ | $\alpha^{249}$ | $\alpha^{5}$ | $\alpha^{16}$ |
| $\alpha^{3}$ | $\alpha^{15}$ | $\alpha^{27}$ | $\alpha^{39}$ | $\alpha^{51}$ | $\alpha^{63}$ | $\alpha^{75}$ | $\alpha^{87}$ |
| $\alpha^{67}$ | $\alpha^{80}$ | $\alpha^{93}$ | $\alpha^{106}$ | $\alpha^{119}$ | $\alpha^{132}$ | $\alpha^{145}$ | $\alpha^{158}$ |
| $\alpha^{131}$ | $\alpha^{145}$ | $\alpha^{159}$ | $\alpha^{173}$ | $\alpha^{187}$ | $\alpha^{201}$ | $\alpha^{215}$ | $\alpha^{229}$ |
| $\alpha^{195}$ | $\alpha^{210}$ | $\alpha^{225}$ | $\alpha^{240}$ | $\alpha^{0}$ | $\alpha^{15}$ | $\alpha^{30}$ | $\alpha^{45}$ |
| $\alpha^{4}$ | $\alpha^{20}$ | $\alpha^{36}$ | $\alpha^{52}$ | $\alpha^{68}$ | $\alpha^{84}$ | $\alpha^{100}$ | $\alpha^{116}$ |

MEMORY CONTROLLERS AND MEMORY SYSTEMS INCLUDING THE SAME

CROSS-REFERENCE TO RELATED APPLICATION

This application claims priority under 35 U.S.C. § 119 to Korean Patent Application No. 10-2022-0162247, filed on Nov. 29, 2022, in the Korean Intellectual Property Office, the disclosure of which is incorporated by reference herein in its entirety.

TECHNICAL FIELD

Aspects of the present disclosure relate to memories, and more particularly, to memory controllers and memory systems including the same.

DISCUSSION OF THE RELATED ART

A memory device may be implemented using a semiconductor such as silicon (Si), germanium (Ge), gallium arsenide (GaAs), indium phosphide (InP), or the like. Memory devices are typically divided into volatile memory devices and nonvolatile memory devices.

A volatile memory device refers to a memory device in which stored data is lost when a power supply is shut down. On the other hand, a nonvolatile memory device refers to a memory device that retains stored data when a power supply is shut down. A dynamic random access memory (DRAM), which is a kind of volatile memory device, has a high access speed, and because of this, the DRAM is widely used as a working memory, a buffer memory, a main memory, or the like of a computing system.

In addition, a plurality of volatile memory devices may be provided in the form of memory modules for a relatively large storage capacity. Researchers are conducting various research projects of efficiently correcting errors that occur in memory modules.

SUMMARY

Some example embodiments provide a memory controller capable of correcting errors occurring in a memory module more efficiently.

Some example embodiments provide a memory system that includes a memory controller capable of correcting errors occurring in a memory module more efficiently.

According to some example embodiments, a memory controller may be configured to control a memory module that includes a plurality of data chips, a first parity chip and a second parity chip, with the memory controller including a system error correction code (ECC) engine and a processor to control the system ECC engine. The system ECC engine includes an ECC decoder and a memory to store a parity check matrix. The ECC decoder selects one of a plurality of ECC decoding schemes based on decoding status flags and corrects a plurality of symbol errors in a read codeword set from the memory module by performing an ECC decoding on the read codeword set based on the selected decoding scheme and the parity check matrix. The decoding status flags are provided from the plurality of data chips and each of the decoding status flags indicates whether at least one error bit is detected in respective one of the plurality of data chips.

According to some example embodiments, a memory system includes a memory module and a memory controller to control the memory module. The memory module includes a plurality of data chips, a first parity chip and a second parity chip. Each of the plurality of data chips includes an on-die error correction code (ECC) engine. The memory controller includes a decoding status flag decoder and an ECC decoder. The decoding status flag decoder receives decoding status flags generated by the plurality of on-die ECC engines, from the memory module, and generates a decision signal indicating erasure number corresponding to the number of decoding status flags having a first logic level, from among the decoding status flags by decoding the decoding status flags. Each of the decoding status flags indicates whether at least one error bit is detected in respective one of the plurality of data chips. The ECC decoder selects one of a plurality of ECC decoding schemes based on the decision signal, and corrects a plurality of symbol errors in a read codeword set from the memory module by performing an ECC decoding on the read codeword set based on the selected decoding scheme and a parity check matrix.

According to some example embodiments, a memory controller to control a memory module including a plurality of data chips, a first parity chip and a second parity chip and to control the memory module by communicating with one or more host through a compute express link (CXL) interface is provided. Each of the plurality of data chips includes an on-die error correction code (ECC) engine. The memory controller includes a decoding status flag decoder and an ECC decoder. The decoding status flag decoder receives decoding status flags generated by the plurality of on-die ECC engines, from the memory module, and generates a decision signal indicating erasure number corresponding to the number of decoding status flags having a first logic level, from among the decoding status flags by decoding the decoding status flags. Each of the decoding status flags indicates whether at least one error bit is detected in respective one of the plurality of data chips. The ECC decoder selects one of a plurality of ECC decoding schemes based on the decision signal, and corrects a plurality of symbol errors in a read codeword set from the memory module by performing an ECC decoding on the read codeword set based on the selected decoding scheme and a parity check matrix.

Accordingly, the ECC decoder in the memory controller, may reduce decoding time interval by performing a Forney algorithm in response to the decoding status flags DSFs indicating that at least one error bit is detected in a portion of the data chips without performing a BM algorithm and CS algorithm when operating in a second decoding mode, may cover misdetection of the on-die ECC engines and may secure an error correction capability when operating in a first decoding mode or a third decoding mode.

BRIEF DESCRIPTION OF THE DRAWINGS

Illustrative, non-limiting example embodiments will be more clearly understood from the following detailed description taken in conjunction with the accompanying drawings.

FIG. 8 illustrates a portion of the Galois field sub matrixes in FIG. 7.

FIG. 9 illustrates a unit matrix in FIG. 8.

FIG. 10 illustrates a portion of the Galois field sub matrixes in FIG. 7.

DETAILED DESCRIPTION

Figure 1:
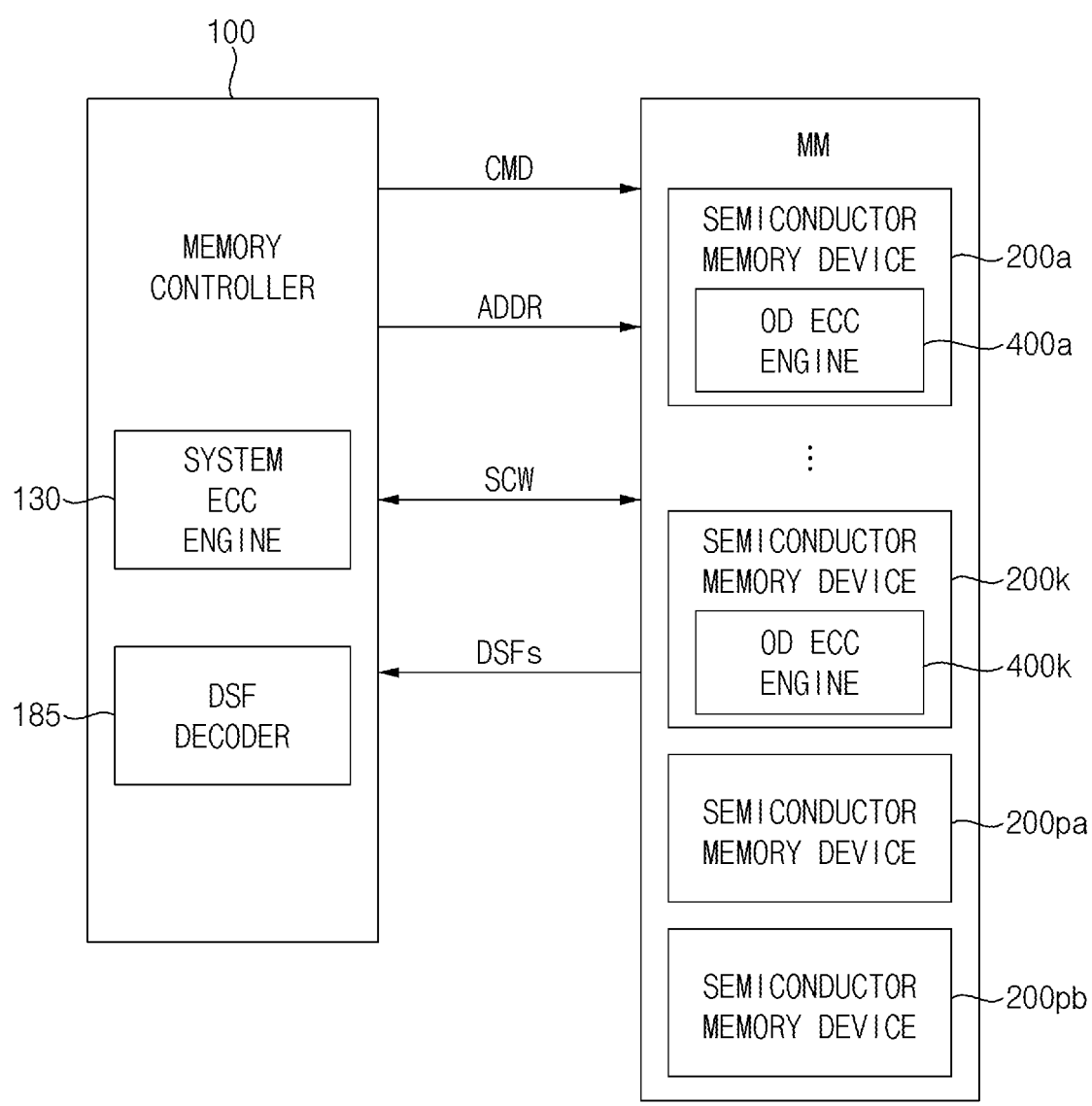
FIG. 1 is a block diagram illustrating a memory system, according to example embodiments.

Example embodiments of the present disclosure will be described more fully hereinafter with reference to the accompanying drawings. Like reference numerals may refer to like elements throughout the accompanying drawings.

FIG. 1 is a block diagram illustrating a memory system according to example embodiments.

Referring to FIG. 1, a memory system 20 may include a memory controller 100 and a memory module MM. The memory module MM may include a plurality of semiconductor memory devices 200a~200k, 200pa and 200pb. Hereinafter, the plurality of semiconductor memory devices 200a~200k, 200pa and 200pb may be referred to as a plurality of memory chips. The plurality of memory chips 200a~200k, 200pa and 200pb may include a plurality of data chips 200a~200k and a first parity chip 200pa and a second parity chip 200pb.

The memory controller 100 may control an overall operation of the memory system 20. The memory controller 100 may control an overall data exchange between a host and the plurality of memory chips 200a~200k, 200pa and 200pb. For example, the memory controller 100 may write data in the plurality of memory chips 200a~200k, 200pa and 200pb or read data from the plurality of memory chips 200a~200k, 200pa and 200pb in response to a request from the host. In addition, the memory controller 100 may issue operation commands to the plurality of memory chips 200a~200k, 200pa and 200pb for controlling the plurality of memory chips 200a~200k. 200pa and 200pb.

In some example embodiments, each of the plurality of memory chips 200a~200k. 200pa and 200pb includes volatile memory cells such as a dynamic random access memory (DRAM).

In some example embodiments, a number of the data chips 200a~200k may be 8. However, the number of the data chips 200a~200k is not limited thereto. In some embodiments, each of the data chips 200a~200k may be referred to as a data memory, and each of the parity chips 200pa and 200pb may be referred to as an error correction code (ECC) memory, or a redundant memory.

The memory controller 100 may transmit an address ADDR and a command CMD to the memory module MM and may exchange a codeword set SCW with the memory module MM.

The memory controller 100 may include a system error correction code (ECC) engine 130 and a decoding status flag (DSF) decoder 185.

The system ECC engine 130 may perform an error correction code (ECC) encoding on a user data set using a parity generation matrix to generate a parity data set, and the system ECC engine 130 may provide the memory module MM with the codeword set SCW including the user data set and the parity data set in a write operation of the memory system 20. The user data set may be stored in the data chips 200a~200k, a first portion of the parity data set may be stored in the first parity chip 200pa and a second portion of the parity data set may be stored in the second parity chip 200pb.

The DSF decoder 185 may receive decoding status flags DSFs from on-die (OD) ECC engines 400a~400k in the data chips 200a~200k in a read operation of the memory system 20. Each of the decoding status flags DSFs may indicate whether at least one error bit is detected in each of the data chips 200a~200k. The DSF decoder 185 may generate a decision signal DS indicating an erasure number corresponding to the number of a decoding status flags having a first logic level, from among the decoding status flags DSFs, by decoding the decoding status flags DSF, and may provide the decision signal DS to the system ECC engine 130.

The system ECC engine 130 may select one of a plurality of ECC decoding schemes based on the decision signal DS or the decoding status flags DSFs, and may correct a plurality of symbol errors in a read codeword set SCW from the memory module MM by performing an ECC decoding on the read codeword set SCW based on the selected decoding scheme and a parity check matrix.

The system ECC engine 130 may reduce a decoding time interval by performing an erasure correction decoding in response to the decoding status flags DSFs that indicate that at least one error bit is detected in a portion (e.g., a number of the data chips 200a~200k sending decoding status flags DSFs is smaller than a pre-determined number) of the data chips 200a~200k, may cover misdetection of the on-die ECC engines 400a~400k by performing an error correction decoding in response to the decoding status flags DSFs indicating that error bit is not detected in the data chips 200a~200k, and may secure an error correction capability by performing an erasure and error correction decoding in response to the decoding status flags DSFs indicating that at least one error bit is detected in a portion (e.g., when the number of the data chips 200a~200k sending decoding status flags DSFs is in a range of pre-determined numbers) of the data chips 200a~200k.

Therefore, the system ECC engine 130 may correct a chip error associated with errors in one data chip, correct random multi-symbol errors occurring in multiple data chips and may correct various types of errors.

Figure 2:
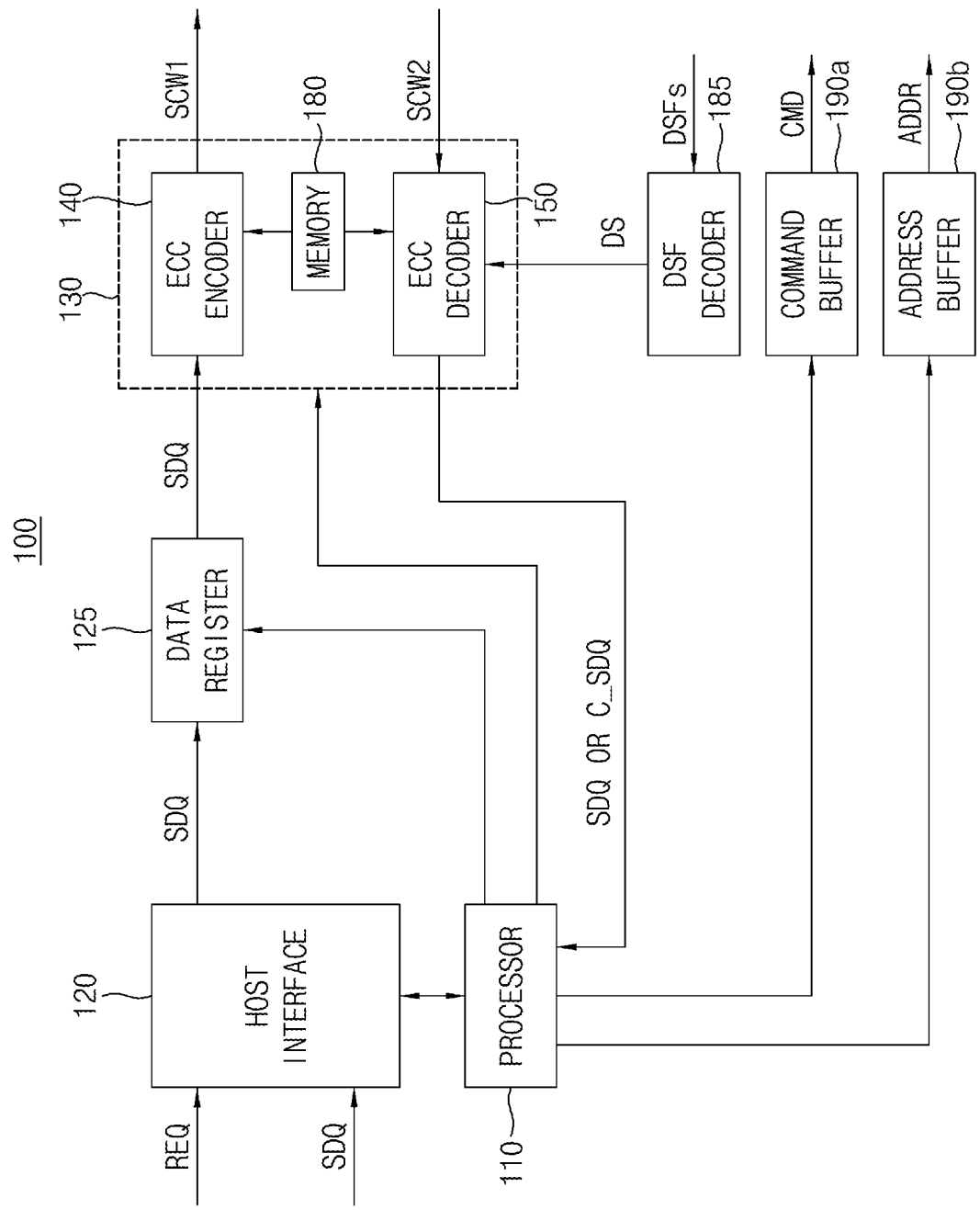
FIG. 2 is block diagram illustrating the memory controller in the memory system of FIG. 1 according to example embodiments.

FIG. 2 is block diagram illustrating an example of the memory controller in the memory system of FIG. 1 according to some example embodiments.

Referring to FIG. 2, the memory controller 100 includes a processor 110, a host interface 120, a data register 125, the system ECC engine 130, the DSF decoder 185, a command buffer 190a and an address buffer 190b. The system ECC engine 130 may include an ECC encoder 140, an ECC decoder 150 and a memory 180.

The host interface 120 may receive a request REQ and a user data set SDQ from the host, and may provide the user data set SDQ to the data register 125. The data register 125 may provide the user data set SDQ to the system ECC engine 130.

The ECC encoder 140 may perform an ECC encoding on the user data set SDQ using a parity generation matrix and may generate a codeword set SCW1.

The ECC decoder 150 may perform an ECC decoding on a codeword set SCW2 provided from the memory module MM using a parity check matrix to correct errors in the codeword set CW2, may provide the processor 110 with one of the user data set SDQ and a corrected user data set C_SDQ. The memory 180 may store the parity generation matrix and the parity check matrix.

The processor 110 may receive the user data set SDQ or the corrected user data set C_SDQ from the ECC decoder 150 and may control the system ECC engine 130, the command buffer 190a and the address buffer 190b. The command buffer 190a may store the command CMD corresponding to the request REQ and may transmit the command CMD to the memory module MM under control of the processor 110. The address buffer 190b may store the address ADDR and may transmit the address ADDR to the memory module MM under control of the CPU 110.

The DSF decoder 185 may receive the decoding status flags DSFs indicating whether at least one error bit is detected in each of the data chips 200a~200k from the memory module MM in a read operation of the memory system 20. The DSF decoder 185 may generate the decision signal DS indicating an erasure number corresponding to the number of a decoding status flags having a first logic level, from among the decoding status flags DSFs, by decoding the decoding status flags DSF, and may provide the decision signal DS to the system ECC engine 130.

Figure 3:
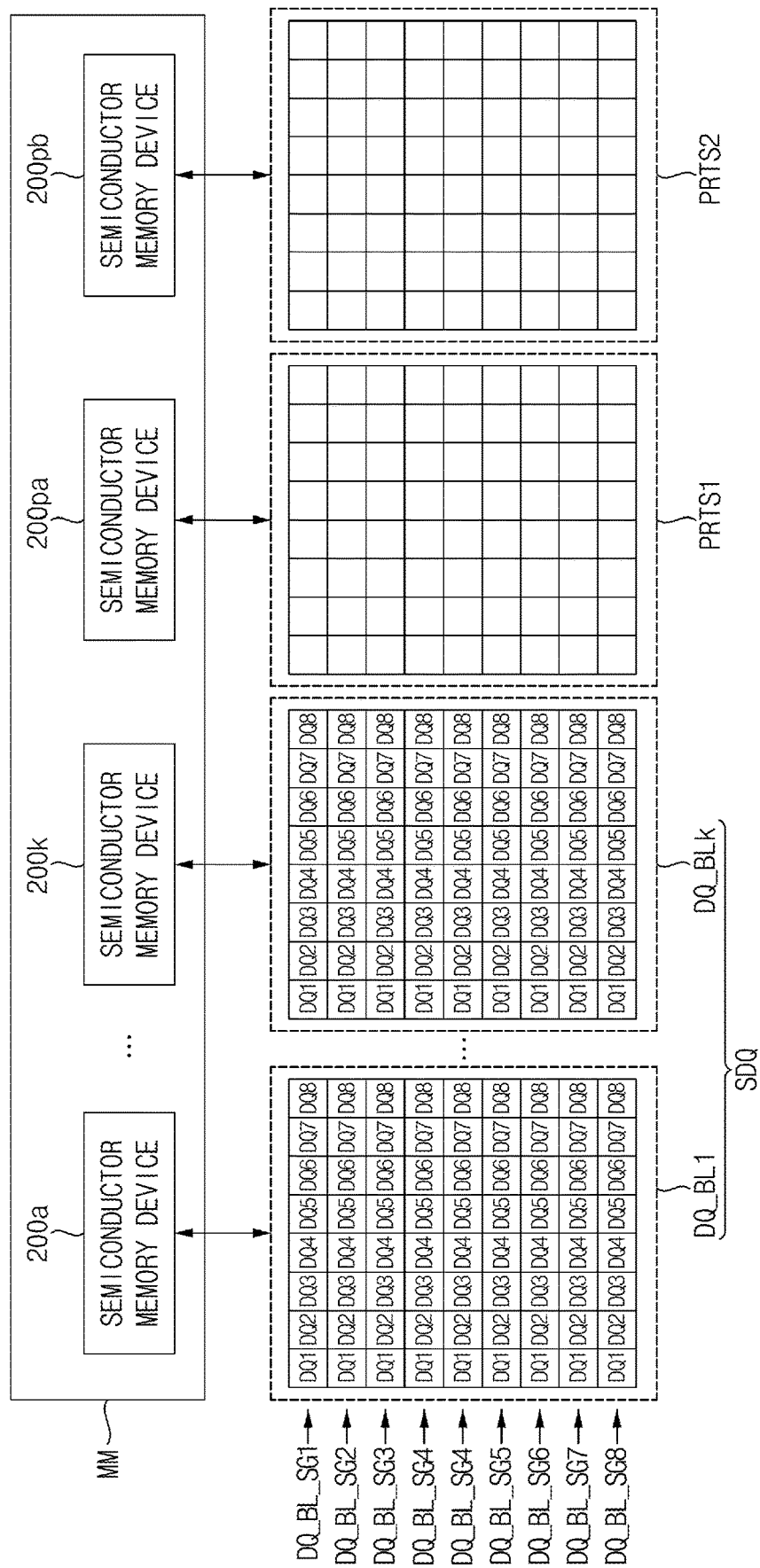
FIG. 3 illustrates data sets corresponding to the plurality of burst lengths in the memory system of FIG. 1, according to example embodiments.

FIG. 3 illustrates data sets corresponding to a plurality of burst lengths in the memory system of FIG. 1, according to some example embodiments.

Referring to FIG. 3, each of the data chips 200a~200k and the parity chips 200pa and 200pb may perform a burst operation. Herein, the burst operation may refer to an operation of writing or reading a large amount of data by sequentially increasing or decreasing an initial address provided from the memory controller 100. A basic unit of the burst operation may be referred to a burst length BL.

Each of the data sets DQ_BL1~DQ_BLk corresponding to the plurality of burst lengths are input to/output from each of the data chips 200a~200k.

Each of the data sets DQ_BL1~DQ_BLk may include data segments DQ_BL_SG1~DQ_BL_SG8 corresponding to each burst length of the plurality of burst lengths. The data sets DQ_BL1~DQ_BL8 may correspond to the user data set SDQ.

The burst length is assumed to be 8 in FIG. 3 and it is assumed that the burst operation is performed once, with the understanding that the present disclosure is not so limited. While the burst operation is performed once in each of the data chips 200a~200k, a first parity data PRTS1 corresponding to the plurality of burst lengths are input to/output from the first parity chip 200pa and a second parity data PRTS2 corresponding to the plurality of burst lengths are input to/output from the second parity chip 200pb.

Figure 4:
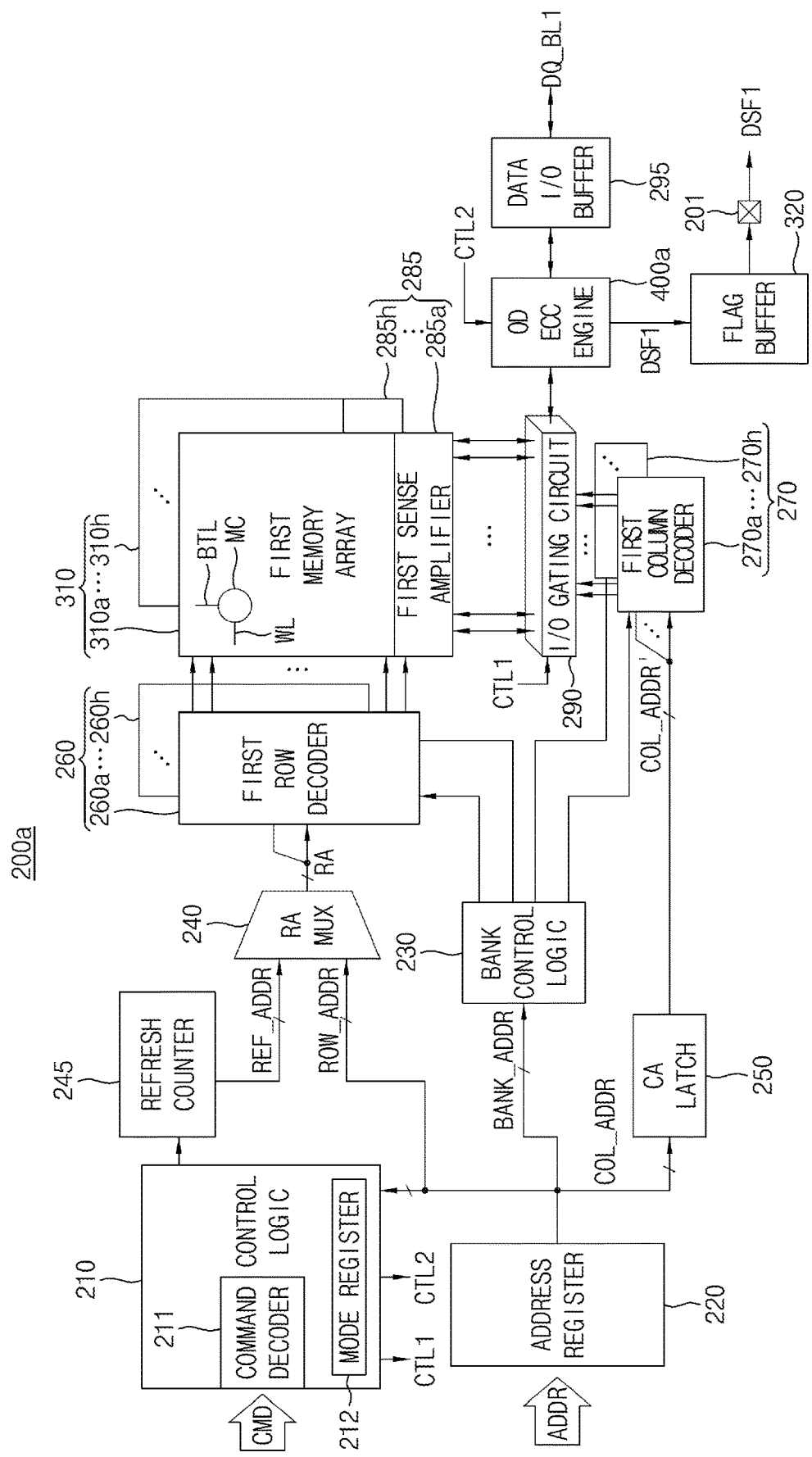
FIG. 4 is a block diagram illustrating one of the data chips in the memory module of FIG. 1 according to example embodiments.

FIG. 4 is a block diagram illustrating one of the data chips in the memory module of FIG. 1 according to some example embodiments.

In FIG. 4, it is assumed that each of the data chips 200a~200k in FIG. 1 employs a volatile memory device.

Referring to FIG. 4, the data chip 200a may include a control logic circuit 210, an address register 220, a bank control logic circuit 230, a row address multiplexer 240, a column address latch 250, a row decoder 260, a column decoder 270, a memory cell array 310, a sense amplifier unit 285, an input/output (I/O) gating circuit 290, an on-die ECC engine 400a, a data input/output (I/O) buffer 295, a refresh counter 245 and a flag buffer 320.

The memory cell array 310 may include first through eighth bank arrays 310a~310h.

The row decoder 260 may include first through eighth bank row decoders 260a~260h coupled to the first through eighth bank arrays 310a~310h, respectively. The column decoder 270 may include first through eighth bank column decoders 270a~270h coupled to the first through eighth bank arrays 310a~310h, respectively. The sense amplifier unit 285 may include first through eighth bank sense amplifiers 285a~285h coupled to the first through eighth bank arrays 310a~310h, respectively.

The first through eighth bank arrays 310a~310h, the first through eighth bank row decoders 260a~260h, the first through eighth bank column decoders 270a~270h, and the first through eighth bank sense amplifiers 285a~285h may form first through eighth banks. Each of the first through eighth bank arrays 310a~310h may include a plurality of word-lines WL, a plurality of bit-lines BTL, and a plurality of memory cells MC formed at intersections of the word-lines WL and the bit-lines BTL.

Although the data chip 200a is illustrated in FIG. 4 as including eight banks, the data chip 200a may include any number of banks.

The address register 220 may receive the address ADDR including a bank address BANK_ADDR, a row address ROW_ADDR, and a column address COL_ADDR from the memory controller 100. The address register 220 may provide the received bank address BANK_ADDR to the bank control logic circuit 230, may provide the received row address ROW_ADDR to the row address multiplexer 240, and may provide the received column address COL_ADDR to the column address latch 250.

The bank control logic circuit 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first through eighth bank row decoders 260a~260h. The address RA that is output from the row address multiplexer 240 may be applied to the activated one of the first through eighth bank row decoders 260a~260h that is activated by the bank control signals from the bank control logic circuit 230.

The activated one of the first through eighth bank row decoders 260a~260h may decode the row address RA that is output from the row address multiplexer 240, and may activate a word-line WL corresponding to the row address RA. For example, the activated bank row decoder 260a~260h may generate a word-line driving voltage and may apply the word-line driving voltage to the word-line WL corresponding to the row address RA.

The column address latch 250 may receive the column address COL_ADDR from the address register 220, and may temporarily store the received column address COL_ADDR. In some example embodiments according to the inventive concepts, in a burst mode, the column address latch 250 may generate column addresses COL_ADDR' that increment from the received column address COL_ADDR. The column address latch 250 may apply the temporarily stored or generated column address COL_ADDR' to the first through eighth bank column decoders 270a~270h.

The activated one of the first through eighth bank column decoders 270a~270h may decode the column address COL_ADDR that is output from the column address latch 250, and may control the I/O gating circuit 290 to output data corresponding to the column address COL_ADDR.

The I/O gating circuit 290 may include circuitry for gating input/output data. The I/O gating circuit 290 may further include read data latches for storing data that is output from the first through eighth bank arrays 310a~310h, and write control devices for writing data to the first through eighth bank arrays 310a~310h.

A codeword to be read from one of the first through eighth bank arrays 310a~310h may be sensed by a sense amplifier coupled to the one bank array from which the data is to be read, and may be stored in the read data latches.

The codeword stored in the read data latches may be provided to the on-die ECC engine 400a. The on-die ECC engine 400a may generate a data set by performing an ECC decoding on the code word and may provide to the data set to the data I/O buffer 295. The data I/O buffer 295 may provide the data set DQ_BL1 to the memory controller 100. Data set DQ_BL1 to be written in one of the first through eighth bank arrays 310~380 may be provided to the data I/O buffer 295 from the memory controller 100. The data I/O buffer 295 may provide the data set to the on-die ECC engine 400a. The on-die ECC engine 400a may generate parity bits based on the data set and may provide the I/O gating circuit 290 with a codeword including the data set and the parity bits. The I/O gating circuit 290 may store the codeword in a sub-page of one bank array.

The on-die ECC engine 400a, in a write operation, may generate the parity bits by performing an ECC encoding on the data set DQ_BL1 from the data I/O buffer 295 and may store a codeword including the data set DQ_BL1 and the parity bits in a target page of the memory cell array 310.

The on-die ECC engine 400a, in a read operation, may read the codeword including the data set and the parity bits from the target page, may detect at least one error bit in the data set by performing an ECC decoding on the data set based on the parity bits and may output a decoding status flag DSF1 having a first logic level to the flag buffer 320, when the at least one error bit is detected in the data set. The on-die ECC engine 400a may provide the data set DQ_BL1 to the data I/O buffer 295 without correcting the detected at least one error bit.

The flag buffer 320 may transmit the decoding status flag DSF1 to the memory controller 100 through a pin 201.

The control logic circuit 210 may control operations of the data chip 200a. For example, the control logic circuit 210 may generate control signals for the data chip 200a to perform the write operation or the read operation. The control logic circuit 210 may include a command decoder 211 that decodes the command CMD received from the memory controller 100 and a mode register 212 that sets an operation mode of the data chip 200a.

For example, the command decoder 211 may generate the control signals corresponding to the command CMD by decoding a write enable signal, a row address strobe signal, a column address strobe signal, a chip select signal, etc.

The control logic circuit 210 may generate a first control signal CTL1 to control the I/O gating circuit 290 and a second control signal CTL2 to control the on-die ECC engine 400a by decoding the command CMD.

Each of the parity chips 200pa and 200pb in FIG. 1 may have substantially the same configuration as the data chip 200a. Each of the parity chips 200pa and 200pb may input/output a corresponding parity data.

Figure 5:
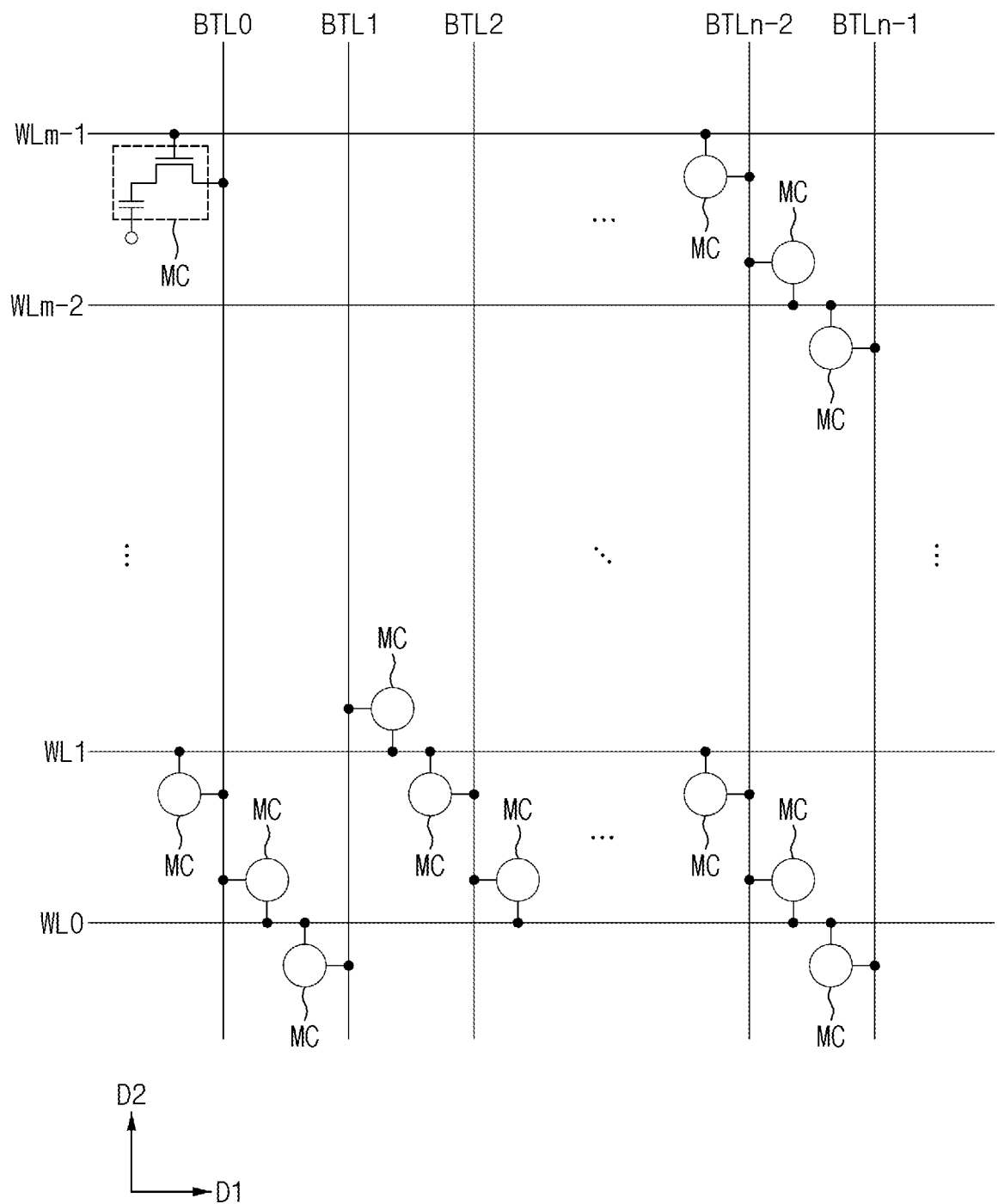
FIG. 5 illustrates an example of the first bank array in the data chip of FIG. 4 according to example embodiments.

FIG. 5 illustrates an example of the first bank array in the data chip of FIG. 4 according to some example embodiments.

Referring to FIG. 5, the first bank array 310a may include a plurality of word-lines WL~WLm−1 (where m is an even number equal to or greater than two), a plurality of bit-lines BTL0~BTLn−1 (where n is an even number equal to or greater than two), and a plurality of memory cells MCs at intersections between the word-lines WL0~WLm−1 and the bit-lines BTL0~BTLn−1.

The word-lines WL~WLm−1 may extend in a first direction D1 and the w bit-lines BTL0~BTLn−1 may extend in a second direction D2.

Each of the memory cells MCs may include an access (cell) transistor coupled to one of the word-lines WL0~WLm-1 and one of the bit-lines BTL0~BTLn-1 and a storage (cell) capacitor coupled to the cell transistor. That is, each of the memory cells MCs has a DRAM cell structure.

In addition, the memory cells MCs may have different arrangement depending on that the memory cells MCs are coupled to an even word-line (for example, WL0) or an odd word-line (for example, WL1). That is, a bit-line coupled to adjacent memory cells may be different depending on whether a word-line selected by an access address is an even word-line or an odd word-line.

Figure 6:
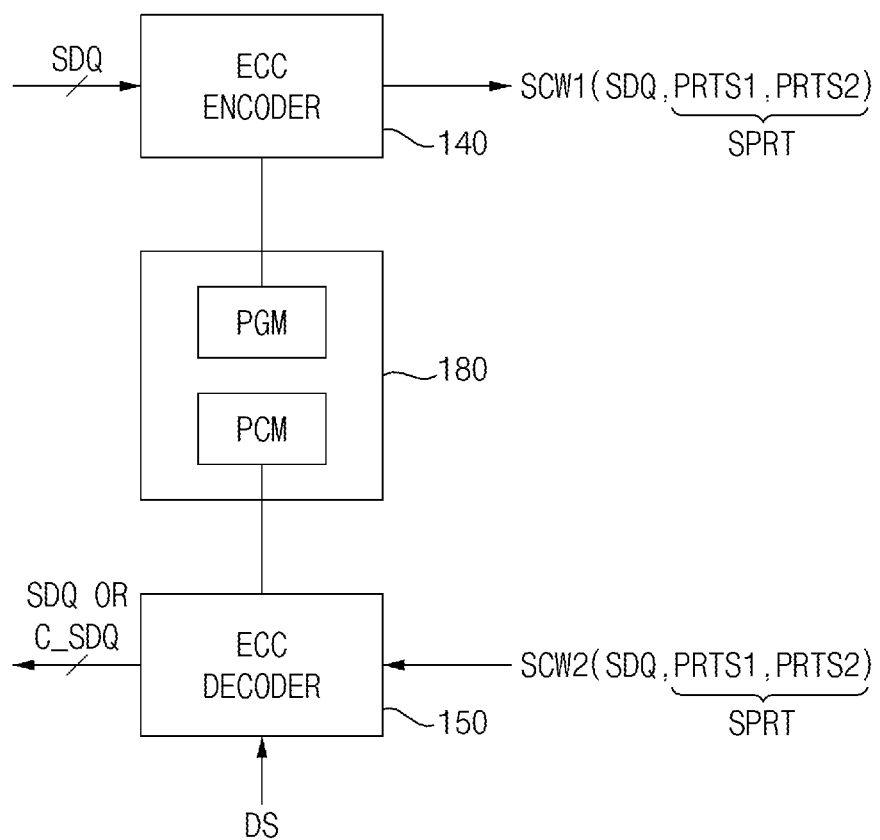
FIG. 6 is a block diagram illustrating an example of the system ECC engine in FIG. 2 according to example embodiments.

FIG. 6 is a block diagram illustrating an example of the system ECC engine in FIG. 2 according to some example embodiments.

Referring to FIG. 6, the system ECC engine 130 may include an ECC encoder 140, an ECC decoder 150 and a memory 180. The memory 180 may be referred to as an ECC memory 180.

The ECC memory 180 may be connected to the ECC encoder 140 and the ECC decoder 150 and may store a parity generation matrix PGM and a parity check matrix PCM.

The ECC encoder 140 may perform an ECC encoding on the user data set SDQ by using the parity generation matrix PCM to generate a parity data set SPRT including the first parity data PRTS1 and the second parity data PRTS2, and may output a codeword set SCW1 including the user data set SDQ, the first parity data PRTS1 and the second parity data PRTS2.

The ECC decoder 150 may select one of a plurality of ECC decoding schemes based on the decision signal DS, may perform an ECC decoding on a codeword set SCW2 including the user data set SDQ and the parity data set SPRT based on the selected decoding scheme and the parity check matrix PCM, may correct a plurality of symbol errors according to an erasure number indicated by the decision signal DS and error type included in the user data set SDQ to output a corrected user data set C_SDQ, or may output the user data set SDQ when the ECC decoder 150 cannot correct a plurality of symbol errors.

Figure 7:
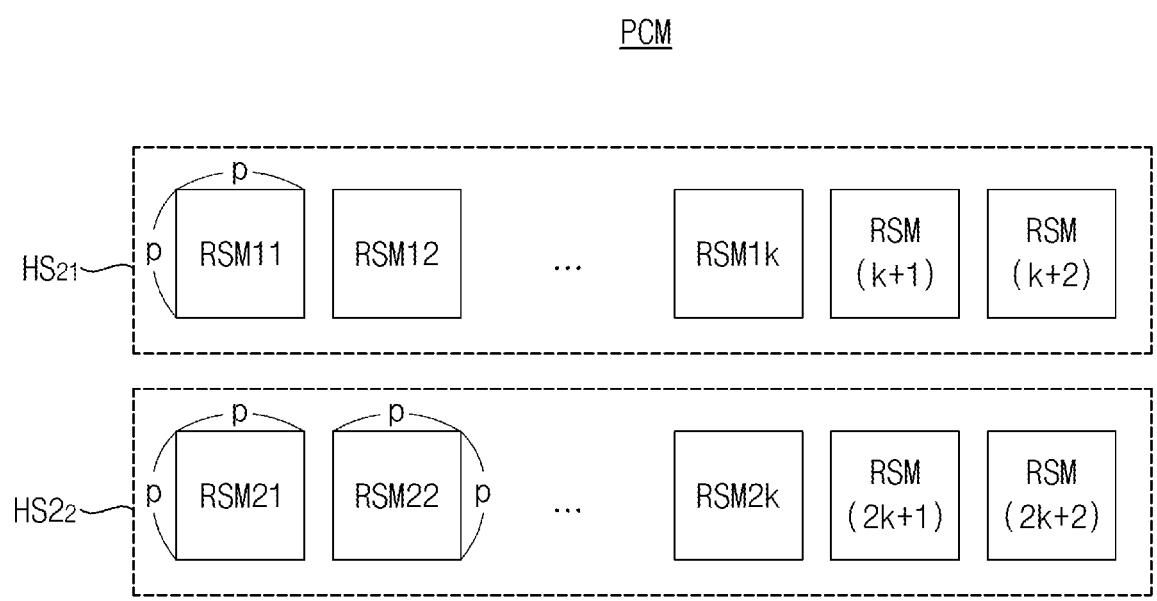
FIG. 7 illustrates an example of a parity check matrix stored in the memory in the system ECC engine of FIG. 6.

FIG. 7 illustrates an example of a parity check matrix stored in the memory in the system ECC engine of FIG. 6.

The parity generation matrix PGM may have a similar configuration with the parity check matrix PCM.

Referring to FIG. 7, the parity check matrix PCM may include a first sub check matrix $HS_{21}$, and a second sub check matrix $HS_{22}$.

The first sub check matrix $HS_{21}$ and the second sub check matrix $HS_{22}$ may be generated based on a Reed-Solomon code and may be used for generating a syndrome.

The first sub check matrix $HS_{21}$ may include k+2 Galois field sub matrixes RSM11, RSM12, ..., RSM1k, RSM(1k+1), RSM(1k+2) corresponding to the data chips 200a~200k, the first parity chip 200pa and the second parity chip 200pb.

The second sub check matrix $HS_{22}$ may include k+2 Galois field sub matrixes RSM21, RSM22, ..., RSM2k, RSM(2k+1), RSM(2k+2) corresponding to the data chips 200a~200k, the first parity chip 200pa and the second parity chip 200pb. Each of the k+2 Galois field sub matrixes RSM11, RSM12, ..., RSM1k, RSM(1k+1), RSM(1k+2) and each of the k+2 Galois field sub matrixes RSM21, RSM22, ..., RSM2k, RSM(2k+1), RSM(2k+2) may have p×p elements. Here, k is an integer greater than two and p is an integer greater than three.

FIG. 8 illustrates a portion of the Galois field sub matrixes in FIG. 7.

Referring to FIG. 8, the Galois field sub matrix RSM11 may include unit matrixes IMs and α matrixes $\alpha^s$, $\alpha^{2s}$, $\alpha^{3s}$, $\alpha^{4s}$, $\alpha^{5s}$, $\alpha^{6s}$ and $\alpha^{7s}$. Here, s is one of 1, 2, 3, 4, 5, 6, 7 and 8. The Galois field sub matrix RSM21 may include unit matrixes IMs and α matrixes $\alpha^{s+8}$, $\alpha^{2(s+8)}$, $\alpha^{3(s+8)}$, $\alpha^{4(s+8)}$, $\alpha^{5(s+8)}$, $\alpha^{6(s+8)}$ and $\alpha^{7(s+8)}$.

Here, the α matrix may be obtained using q-order primitive polynomial. $\alpha^2$ may be obtained by involution of α. Elements of the α matrixes may belong to a Galois field.

Figure 9:
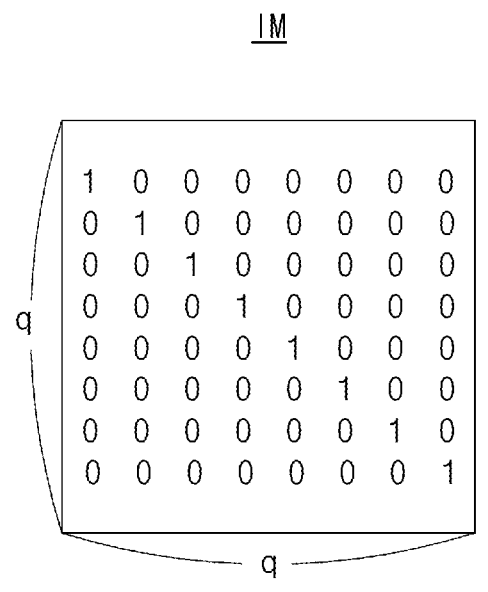

FIG. 9 illustrates a unit matrix in FIG. 8.

Referring to FIG. 9, q elements in a diagonal direction have a logic high level (i.e., '1' value) and other elements (e.g., all other elements) except the q elements in a diagonal direction have a logic low level (i.e., '0' value).

FIG. 10 illustrates a portion of the Galois field sub matrixes in FIG. 7.

In FIG. 10, it is assumed that k is 8.

Referring to FIG. 10, a Galois field sub matrix RSM(1k+1) and a Galois field sub matrix RSM(2k+1) may include α matrixes $\alpha^{64} \sim \alpha^{71}$, $\alpha^{128} \sim \alpha^{142}$, $\alpha^{192} \sim \alpha^{213}$, $\alpha^1 \sim \alpha^{29}$, $\alpha^{65} \sim \alpha^{100}$, $\alpha^{129} \sim \alpha^{171}$, $\alpha^{193} \sim \alpha^{242}$ and $\alpha2 \sim \alpha^{58}$ whose exponential value is 255 or less. The α matrixes included in the Galois field sub matrix RSM(1k+1) and the Galois field sub matrix RSM(2k+1) are elements of a Galois field GF(256), and the exponential value may have one of 1 through 255.

Figure 11:
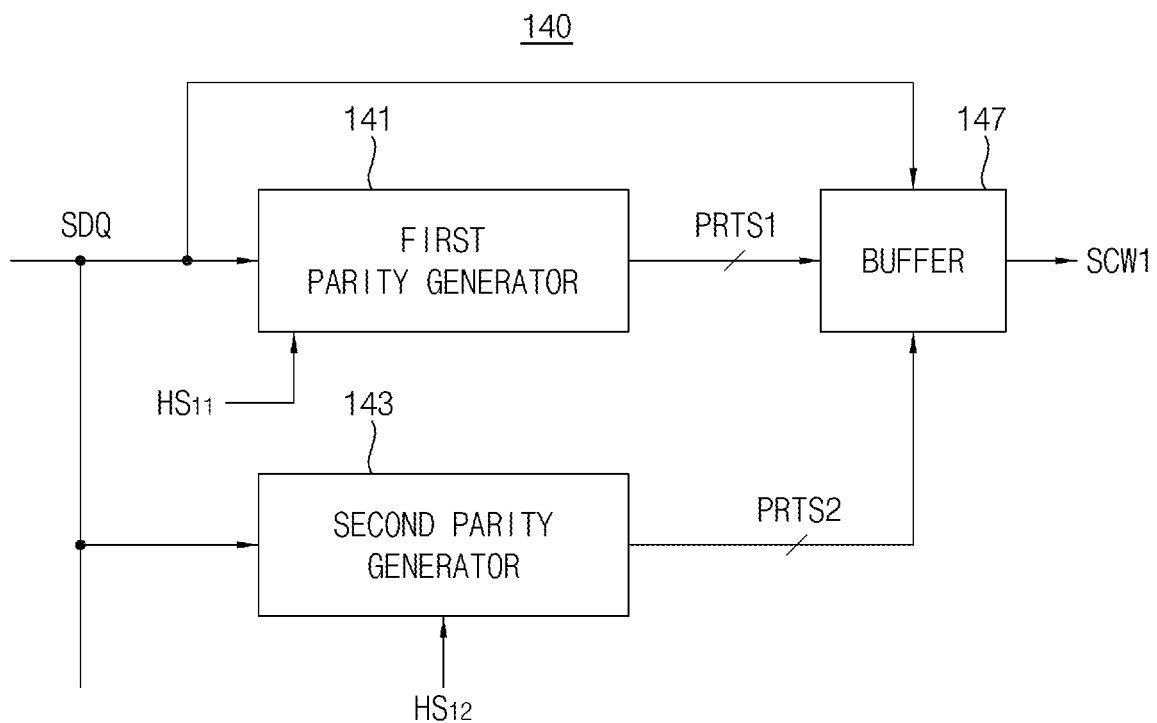
FIG. 11 illustrates an example of the ECC encoder in the system ECC engine of FIG. 6 according to example embodiments.

FIG. 11 illustrates an example of the ECC encoder in the system ECC engine of FIG. 6 according to some example embodiments.

Referring to FIG. 11, the ECC encoder 140 may include first parity generator 141, a second parity generator 143 and a buffer 147.

The first parity generator 141 may perform an ECC encoding on the user data set SDQ on a symbol basis using the first sub generation matrix $HS_{11}$ to generate the first parity data PRTS1 and may provide the first parity data PRTS1 to the buffer 147. The first parity generator 141 may generate the first parity data PRTS1 by performing α matrix-multiplication operation on the user data set SDQ and the first generation matrix $HS_{11}$.

The second parity generator 143 may perform an ECC encoding on the user data set SDQ on a symbol basis using the second sub generation matrix $HS_{12}$ to generate the second parity data PRTS2 and may provide the second parity data PRTS2 to the buffer 147. The second parity generator 143 may generate the second parity data PRTS2 by performing α matrix-multiplication operation on the user data set SDQ and the second generation matrix $HS_{12}$.

The buffer 147 may receive the user data set SDQ, the first parity data PRTS1 and the second parity data PRTS2 and may provide the memory module MM with the codeword set SCW1 including the user data set SDQ, the first parity data PRTS1 and the second parity data PRTS2.

Figure 12:
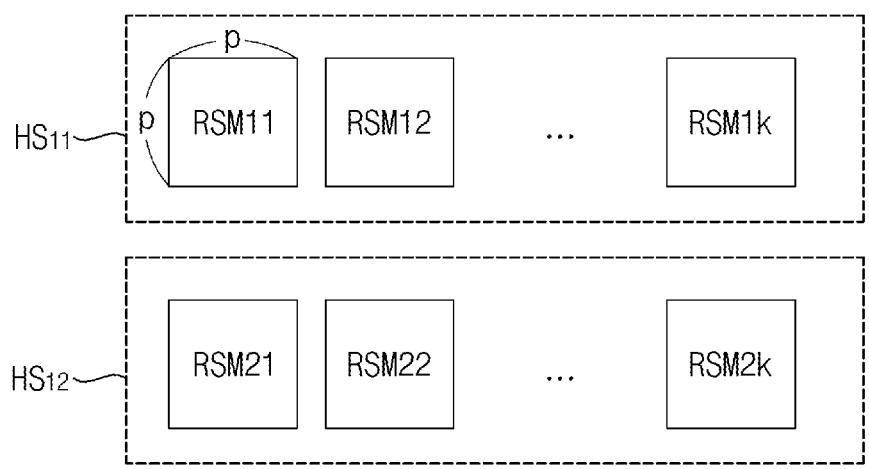
FIG. 12 illustrates an example of the parity generation matrix stored in the memory in the error correction circuit of FIG. 6.

FIG. 12 illustrates an example of the parity generation matrix stored in the memory in the error correction circuit of FIG. 6.

Referring to FIG. 12, the parity generation matrix PGM may include a first sub generation matrix $HS_{11}$ and a second sub generation matrix $HS_{12}$.

The first sub generation matrix $HS_{11}$ may include Galois field sub matrixes RSM11, RSM12, ..., RSM1k corresponding to the data chips 200a~200k. The second sub generation matrix $HS_{12}$ may include Galois field sub matrixes RSM21, RSM22, ..., RSM2k corresponding to the data chips 200a~200k. The first sub generation matrix $HS_{11}$ and the second sub generation matrix $HS_{12}$ may be generated based on Reed-Solomon code.

Figure 13:
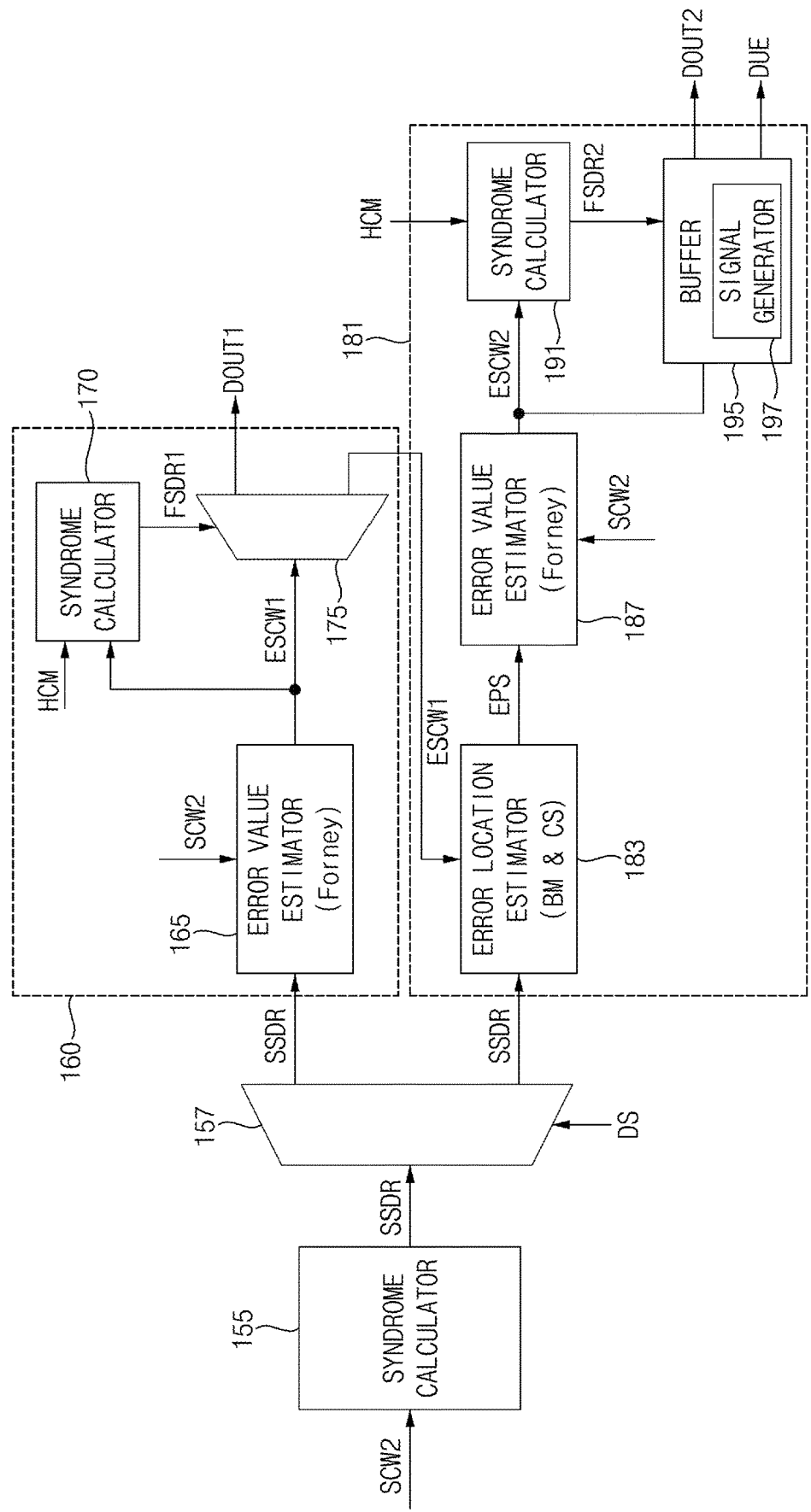
FIG. 13 is a block diagram illustrating an example of the ECC decoder in the system ECC engine of FIG. 6 according to example embodiments.

FIG. 13 is a block diagram illustrating an example of the ECC decoder in the system ECC engine of FIG. 6 according to example embodiments.

Referring to FIG. 13, the ECC decoder 150 may include a syndrome calculator 155, a demultiplexer 157, a first sub decoder 160 and a second sub decoder 181. The syndrome calculator 155 may be referred to as a first syndrome calculator 155.

The first sub decoder 160 may include an error value estimator 165, a syndrome calculator 170 and a demultiplexer 175. The second sub decoder 181 may include an error location estimator 183, an error value estimator 187, a syndrome calculator 191 and a buffer 195. The syndrome calculator 170 may be referred to as a second syndrome calculator 170 and the syndrome calculator 191 may be referred to as a third syndrome calculator 191. The error value estimator 165 may be referred to as a first error value estimator 165, and the error value estimator 187 may be referred to as a second error value estimator 187. Each of the first error value estimator 165 and the second error value estimator 187 may perform a Forney algorithm. The error location estimator 183 may perform a Berlekamp-Massey (BM) algorithm and a Chien search (CS) algorithm.

The first syndrome calculator 155 may generate a syndrome SSDR by performing a matrix-multiplication operation on a read codeword set SCW2 and the parity check matrix PCM.

The demultiplexer 157 may provide the syndrome SSDR to one of the first sub decoder 160 and the second sub decoder 181 based on the decision signal DS indicating an erasure number. The demultiplexer 157 may provide the syndrome SSDR to the first sub decoder 160 through a second path in a second decoding mode and may provide the syndrome SSDR to the second sub decoder 181 through a first path in a first decoding mode and a third decoding mode, based on the decision signal DS.

The first error value estimator 165, in response to the erasure number being greater than zero and being equal to or smaller than 2t, may generate a first estimated codeword set ESCW1 by performing a Forney algorithm on the read codeword set SCW2 based on the syndrome SSDR received through the second path to correct symbol errors in the read codeword set SCW2. Here, t may be a natural number indicating a number of correctable symbol errors by the ECC decoder 150 using a first decoding and 2t may indicate a number of correctable symbol errors by the ECC decoder 150 using a second decoding. The first error value estimator 165 may provide the first estimated codeword set ESCW1 to the syndrome calculator 170 and the demultiplexer 175.

The second syndrome calculator 170 may generate a first final syndrome FSDR1 by performing a matrix-multiplication operation on the first estimated codeword set ESCW1 and the parity check matrix PCM and may provide the first final syndrome FSDR1 to the demultiplexer 175.

The demultiplexer 175 may receive the first estimated codeword set ESCW1 and may provide the first estimated codeword set ESCW1 as a first output data DOUT1, or may provide the first estimated codeword set ESCW1 to the second sub decoder 181 based on the first final syndrome FSDR1. The demultiplexer 175, in response to the first final syndrome FSDR1 being zero, may provide the first estimated codeword set ESCW1 as the first output data DOUT1 and, in response to the first final syndrome FSDR1 being non-zero, may provide the first estimated codeword set ESCW1 to the second sub decoder 181.

The error location estimator 183, in response to the erasure number being zero, may generate an error position signal EPS by generating coefficients of an error locator polynomial by performing the BM algorithm on the syndrome SSDR or the first estimated codeword set ESCW1 and by searching an error position by performing a CS algorithm based on the coefficients.

The error value estimator 187 may generate a second estimated codeword set ESCW2 by performing a Forney algorithm on the read codeword set SCW2 based on the error position signal EPS to correct symbol errors in the read codeword set SCW2. The error value estimator 187 may provide the second estimated codeword set ESCW2 to the syndrome calculator 191 and the buffer 195.

The syndrome calculator 191 may generate a second final syndrome FSDR2 by performing a matrix-multiplication operation on the second estimated codeword set ESCW2 and the parity check matrix PCM and may provide the second final syndrome FSDR2 to the buffer 195.

The buffer 195, in response to the second final syndrome FSDR2 being zero, may provide the second estimated codeword set ESCW2 that is stored therein as a second output data DOUT2 and, in response to at least one of syndrome values of the second final syndrome FSDR2 being non-zero, may output an uncorrectable error signal DUE indicating that uncorrectable symbol errors occur in the read codeword set SCW2. The buffer 195 may include a signal generator 197 and the signal generator 197 may generate the uncorrectable error signal DUE based on the syndrome values of the second final syndrome FSDR2.

When a vector representation of the read codeword set SCW2 corresponds to $r^T$, and a vector representation of the syndrome SSDR corresponds to S, $S=HCM \times r^T$. When a vector representation of the estimated codeword set ECW corresponds to $er^T$, and a vector representation of the final syndrome DSDR corresponds to FS, $FS=HCM \times er^T$.

Therefore, the ECC decoder 150, based on the decoding status flags DSFs, may perform the second decoding in the first sub decoder 160 in the second decoding mode and may perform the first decoding or the second decoding in the second sub decoder 181 in the first decoding mode and the third decoding mode.

When at least a portion of the decoding status flags DSFs indicate that error bits are detected in at least a portion of the data chips 200a~200k, that is, when the decision signal DS indicates that error bits are detected in at least a portion of the data chips 200a~200k, the ECC decoder 150 may operate in the second decoding mode, and may generate the first estimated codeword set ESCW1 by performing a Forney algorithm on the read codeword set SCW2 based on the syndrome SSDR to correct symbol errors in the read codeword set SCW2 without performing a BM algorithm and a CS algorithm of the error location estimator 183, which may increase calculation latency. The ECC decoder 150 may reduce decoding time interval in the second decoding mode.

Figure 14:
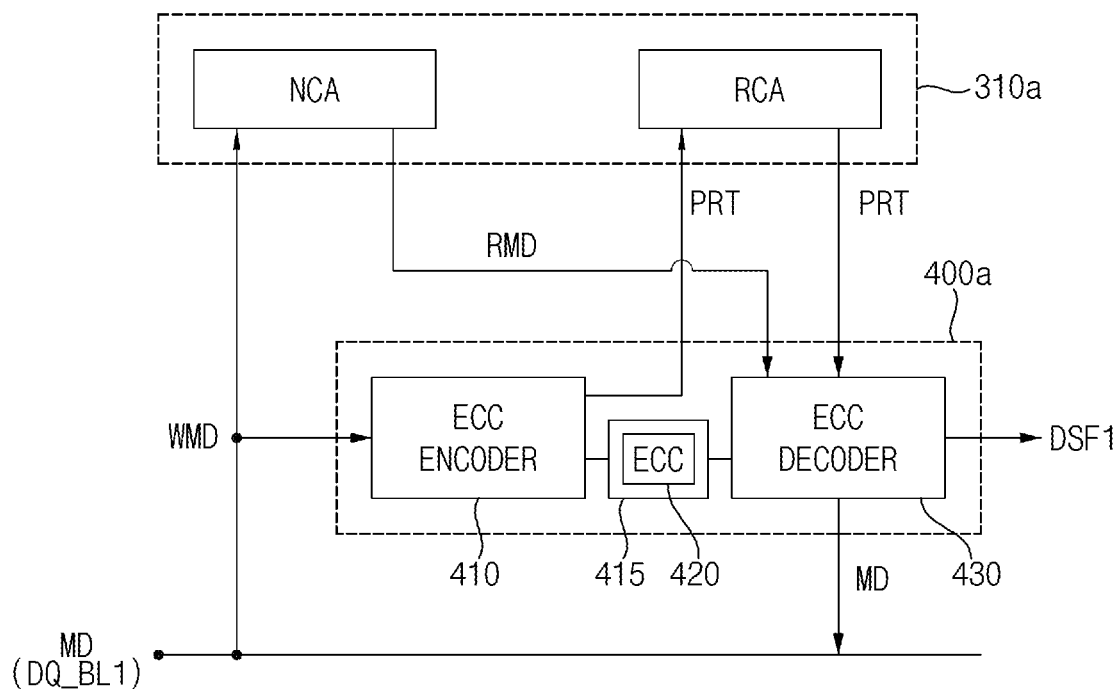
FIG. 14 is a block diagram illustrating an example of an on-die ECC engine included in the data chip of FIG. 4 according to example embodiments.

FIG. 14 is a block diagram illustrating an example of an on-die ECC engine included in the data chip of FIG. 4 according to some example embodiments.

In FIG. 14, for convenience of explanation, the first bank array 310a is illustrated. The first bank array 310a may include a normal cell array NCA and a redundancy cell array RCA.

Referring to FIG. 14, the on-die ECC engine 400a may include an ECC encoder 410, a memory 415 and an ECC decoder 430.

The memory 415 may store an ECC 420. For example, the ECC 420 may be a single error correction/double error detection (SECDED) code. However, the present disclosure is not limited thereto.

Using the ECC 420, the ECC encoder 410 may generate parity data PRT associated with write data WMD to be stored in a normal cell array NCA of the first bank array 310a. The parity data PRT may be stored in a redundancy cell array RCA of the first bank array 310a.

Using the ECC 420, the ECC decoder 430 may perform an ECC decoding on read data RMD based on the read data RMD and the parity data PRT read respectively from the normal cell array NCA and redundant cell array RCA of the first bank array 310a. When the read data RMD includes at least one error bit as a result of the ECC decoding, the ECC decoder 430 may generate the decoding status flag DSF1 and may provide the decoding status flag DSF1 to the memory controller 100, and may not correct the error bit in the read data RMD and output a main data MD in a read operation. The main data MD may correspond to data set DQ_BL1.

Figure 15:
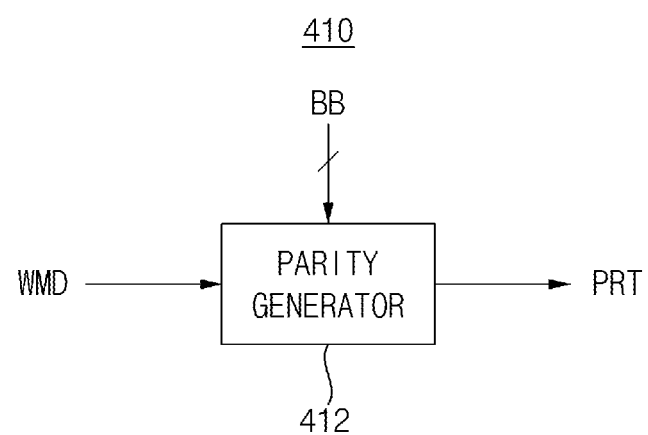
FIG. 15 is a block diagram illustrating an example of an ECC encoder included in the on-die ECC engine of FIG. 14.

FIG. 15 is a block diagram illustrating an example of an ECC encoder included in the on-die ECC engine of FIG. 14.

Referring to FIG. 15, the ECC encoder 410 may include a parity generator 412. The parity generator 412 may receive the write data WMD and basis bits BB, and may generate the parity data PRT by performing, for example, an XOR array operation.

Figure 16:
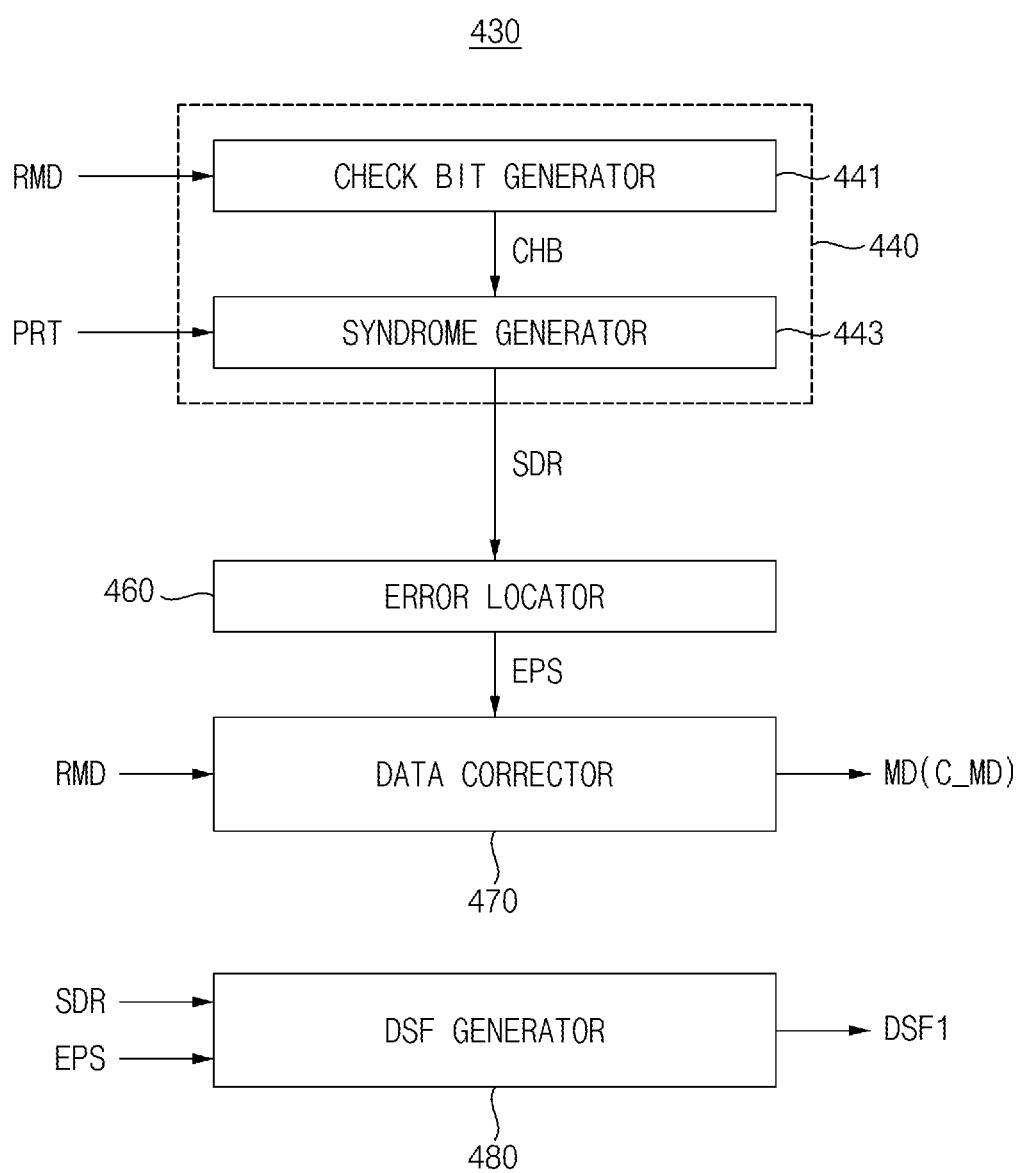
FIG. 16 is a block diagram illustrating an example of the ECC decoder included in the on-die ECC engine of FIG. 12.

FIG. 16 is a block diagram illustrating an example of the ECC decoder included in the on-die ECC engine of FIG. 12.

Referring to FIG. 16, the ECC decoder 430 may include a syndrome generation circuit 440, an error locator 460, a data corrector 470 and a DSF generator 480. The syndrome generation circuit 440 may include a check bit generator 441 and a syndrome generator 443.

The syndrome generation circuit 440 may generate a syndrome SDR based on the read data RMD and the parity data PRT. The check bit generator 441 may generate check bits CHB based on the read data RMD by performing, an XOR array operation. The syndrome generator 443 may generate the syndrome SDR by comparing corresponding bits of the parity data PRT and the check bits CHB.

When all bits of the syndrome SDR are non-zero, the error locator 460 may generate an error position signal EPS representing a position of an error bit in the read data RMD, and may provide the error position signal EPS to the data corrector 470.

The data corrector 470 may receive the read data RMD. When the read data RMD includes an error bit, the data corrector 470 may output corrected main data C_MD by correcting the error bit in the read data RMD or may output the main data MD without correcting the error bit in the read data RMD.

The DSF generator 480 may generate the decoding status flag DSF1 indicating whether the read data RMD includes at least one error bit based on the syndrome SDR and the error position signal EPS. For example, DSF generator 480 may generate the decoding status flag DSF1 with a first logic level (a logic high level) when the read data RMD includes at least one error bit and may generate the decoding status flag DSF1 with a second logic level (a logic low level) when the read data RMD includes no error bit.

Figure 17:
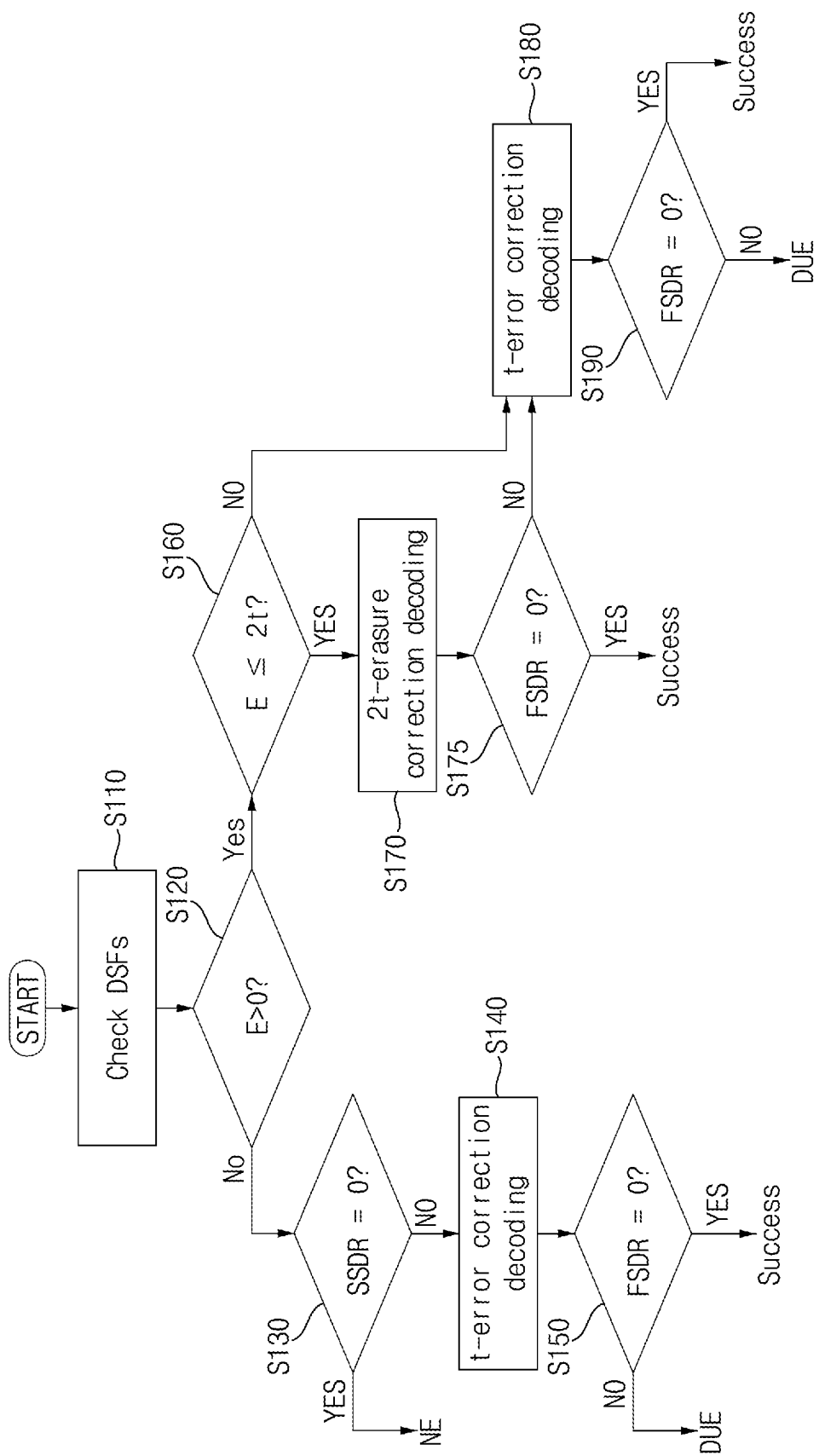
FIG. 17 is a flow chart illustrating an example of decoding operation of the system ECC engine according to example embodiments.

FIG. 17 is a flow chart illustrating an example of decoding operation of the system ECC engine according to some example embodiments.

Referring to FIGS. 2, 6, 13 and 17, the ECC decoder 150 may select one of a plurality of ECC decoding schemes based on an erasure number corresponding to the number of decoding status flags that have a first logic level, from among the decoding status flags DSFs, based on the decision signal DS. The plurality of ECC decoding schemes may include a first decoding and a second decoding, the first decoding may correspond to a t-error correction decoding and the second decoding may correspond to a 2t-erasure and correction decoding. Here, t may be a natural number indicating a number of correctable symbol errors by the ECC decoder 150 using the first decoding and 2t indicates a number of correctable symbol errors by the ECC decoder 150 using the second decoding.

That is, the ECC decoder 150 may check the decoding status flags DSFs (operation S110) and may determine whether an erasure number E is greater than zero based on the decoding status flags having a first logic level (operation S120).

In response to the erasure number E being zero (NO in S120), the ECC decoder 150 may determine whether the syndrome SSDR generated by the first syndrome calculator 155 is zero (operation S130). In response to the syndrome SSDR being zero (YES in S130), the ECC decoder 150 may determine that the read codeword set SCW2 includes no symbol error denoted by NE.

In response to the syndrome SSDR being non-zero (NO in S130), the ECC decoder 150 may perform a first ECC decoding on the read codeword set SCW2 (operation S140) to generate an estimated codeword set, may generate a final syndrome FSDR by performing a syndrome calculation on the estimated codeword set and may determine whether the final syndrome FSDR is zero (operation S150).

In response to the final syndrome FSDR being zero (YES in S150), the ECC decoder 150 may determine that successful decoding denoted by SUCCESS and, in response to the final syndrome FSDR being non-zero (NO in S150), the ECC decoder 150 may determine that the estimated codeword set includes uncorrectable symbol errors denoted by DUE.

In response to the erasure number E being greater than zero (YES in S120), the ECC decoder 150 may determine whether the erasure number E is equal to or smaller than 2t (operation S160).

In response to the erasure number E being equal to or smaller than 2t (YES in S160), the ECC decoder 150 may perform a second ECC decoding on the read codeword set SCW2 (operation S170) to generate an estimated codeword set, may generate a final syndrome FSDR by performing a syndrome calculation on the estimated codeword set and may determine whether the final syndrome FSDR is zero (operation S175).

In response to the final syndrome FSDR being zero (YES in S175), the ECC decoder 150 may determine that successful decoding denoted by SUCCESS. In response to the final syndrome FSDR being non-zero (NO in S175) or in response to the erasure number E being greater than 2t (NO in S160), the ECC decoder 150 may perform a first ECC decoding on the read codeword set SCW2 (operation S180) to generate an estimated codeword set, may generate a final syndrome FSDR by performing a syndrome calculation on the estimated codeword set and may determine whether the final syndrome FSDR is zero (operation S190).

In response to the final syndrome FSDR being zero (YES in S190), the ECC decoder 150 may determine that successful decoding denoted by SUCCESS and, in response to the final syndrome FSDR being non-zero (NO in S190), the ECC decoder 150 may determine that the estimated codeword set includes uncorrectable symbol errors denoted by DUE.

Therefore, the ECC decoder 150 may reduce a decoding time interval by performing (e.g., immediately performing) the second (ECC) decoding when the erasure number E is greater than zero and equal to or smaller than 2t, the ECC decoder 150 may cover mis-detections of the on-die ECC engine 400a~400k when the erasure number E is zero, and the ECC decoder 150 may secure error correction capability when the erasure number E is greater than 2t.

Figure 18:
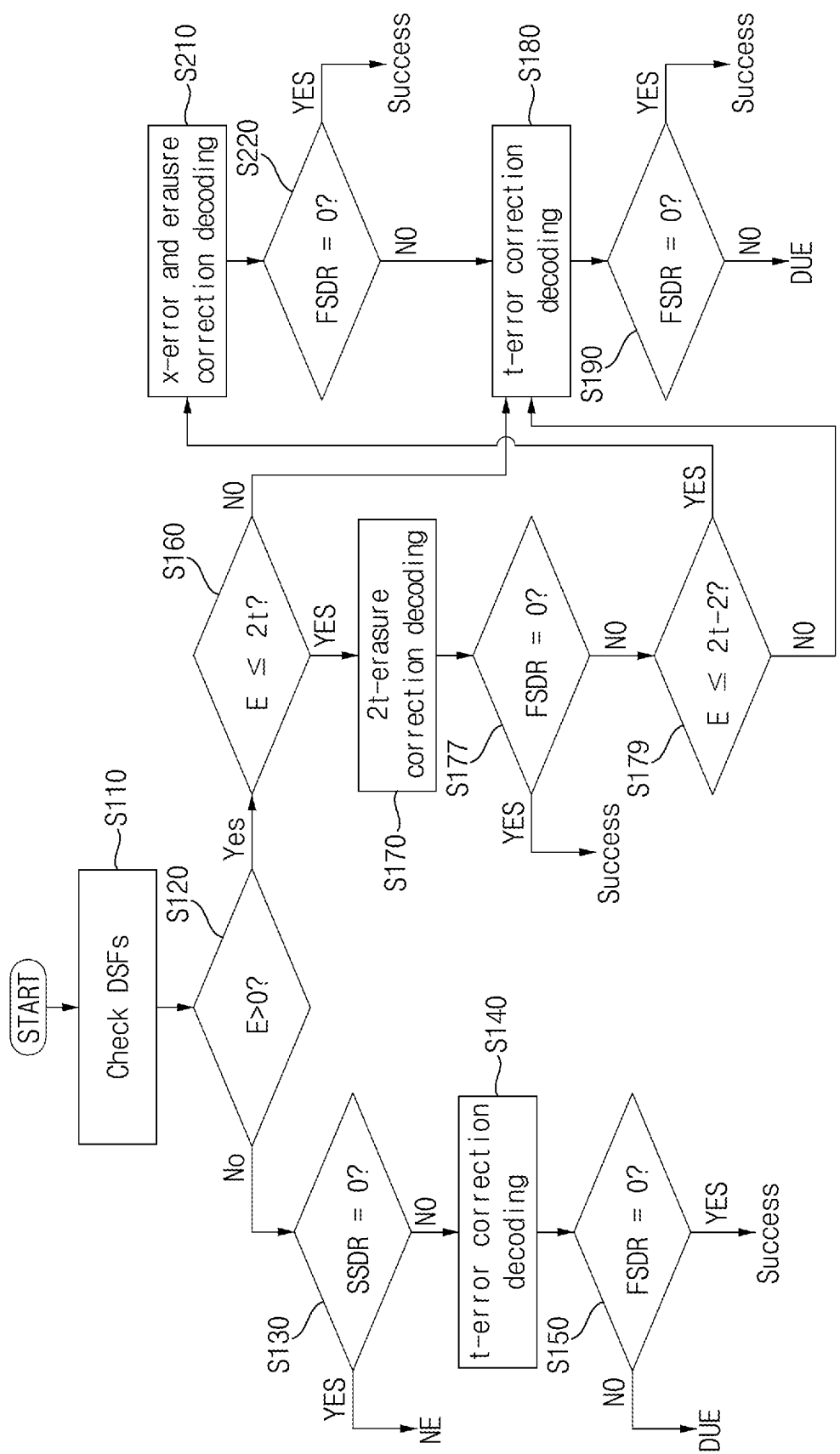
FIG. 18 is a flow chart illustrating an example of decoding operation of the system ECC engine according to example embodiments.

FIG. 18 is a flow chart illustrating an example of decoding operation of the system ECC engine according to some example embodiments.

Referring to FIGS. 2, 6, 13 and 18, the ECC decoder 150 may select one of a plurality of ECC decoding schemes based on an erasure number corresponding to the number of decoding status flags having a first logic level, from among the decoding status flags DSFs based on the decision signal DS. The plurality of ECC decoding schemes may include a first decoding, a second decoding and a third decoding, the first decoding may correspond to a t-error correction decoding, the second decoding may correspond to a 2t-erasure correction decoding and the third decoding may correspond to an x-error and erasure decoding. Here, t may be a natural number indicating a number of correctable symbol errors by the ECC decoder 150 using the first decoding. 2t indicates a number of correctable symbol errors by the ECC decoder 150 using the second decoding, x indicates a number of correctable symbol errors by the ECC decoder using the third decoding and x may be a natural number greater than t and smaller than 2t.

Descriptions on operations S110, S120, S130, S140, S150, S160 and S170 are repeated with FIG. 17 and will be omitted.

In response to the erasure number E being equal to or smaller than 2t (YES in S160), the ECC decoder 150 may perform a second ECC decoding on the read codeword set SCW2 (operation S170) to generate an estimated codeword set, may generate a final syndrome FSDR by performing a syndrome calculation on the estimated codeword set and may determine whether the final syndrome FSDR is zero (operation S177).

In response to the final syndrome FSDR being zero (YES in S177), the ECC decoder 150 may determine that successful decoding denoted by SUCCESS. In response to the final syndrome FSDR being non-zero (NO in S1757, the ECC decoder 150 may determine whether the erasure number E is equal to or smaller than 2t−2 (operation S179).

In response to the erasure number E being equal to or smaller than 2t−2 (YES in S179), the ECC may perform a third ECC decoding on the read codeword set SCW2 (operation S210) to generate an estimated codeword set, may generate a final syndrome FSDR by performing a syndrome calculation on the estimated codeword set and may determine whether the final syndrome FSDR is zero (operation S220).

In response to the final syndrome FSDR being zero (YES in S220), the ECC decoder 150 may determine that successful decoding denoted by SUCCESS. In response to the final syndrome FSDR being non-zero (NO in S210), in response to the erasure number E being greater than 2t (NO in S160) or in response to the erasure number E being greater than 2t−2 (NO in S179), the ECC decoder 150 may perform a first ECC decoding on the read codeword set SCW2 (operation S180) to generate an estimated codeword set, may generate a final syndrome FSDR by performing a syndrome calculation on the estimated codeword set and may determine whether the final syndrome FSDR is zero (operation S190).

In response to the final syndrome FSDR being zero (YES in S190), the ECC decoder 150 may determine that successful decoding denoted by SUCCESS and, in response to the final syndrome FSDR being non-zero (NO in S190), the ECC decoder 150 may determine that the estimated codeword set includes uncorrectable symbol errors denoted by DUE.

FIGS. 19 through 22 illustrate various types of errors that the ECC decoder may correct according to some example embodiments.

In FIGS. 19 through 22, assuming that chips CHIP1~CHIP8 correspond to the data chip 200a~200k in FIG. 3, each of the chips CHIP1~CHIP8 may output respective one of data sets DQ_BL1~DQ_BL8, the first parity chip 200pa may output the first parity data PRTS1 and the second parity chip 200pb may output the second parity data PRTS2.

In addition, assuming that each of the first parity data PRTS1 and the second parity data PRTS2 includes eight parity symbols, the ECC decoder 150 may correct a random symbol error by using two parity symbols and the ECC decoder 150 may correct a symbol error of which error position is known by using one parity symbol.

In addition, in FIGS. 19 through 22, X denotes a symbol error which occurs in data on a symbol basis.

Figure 19:
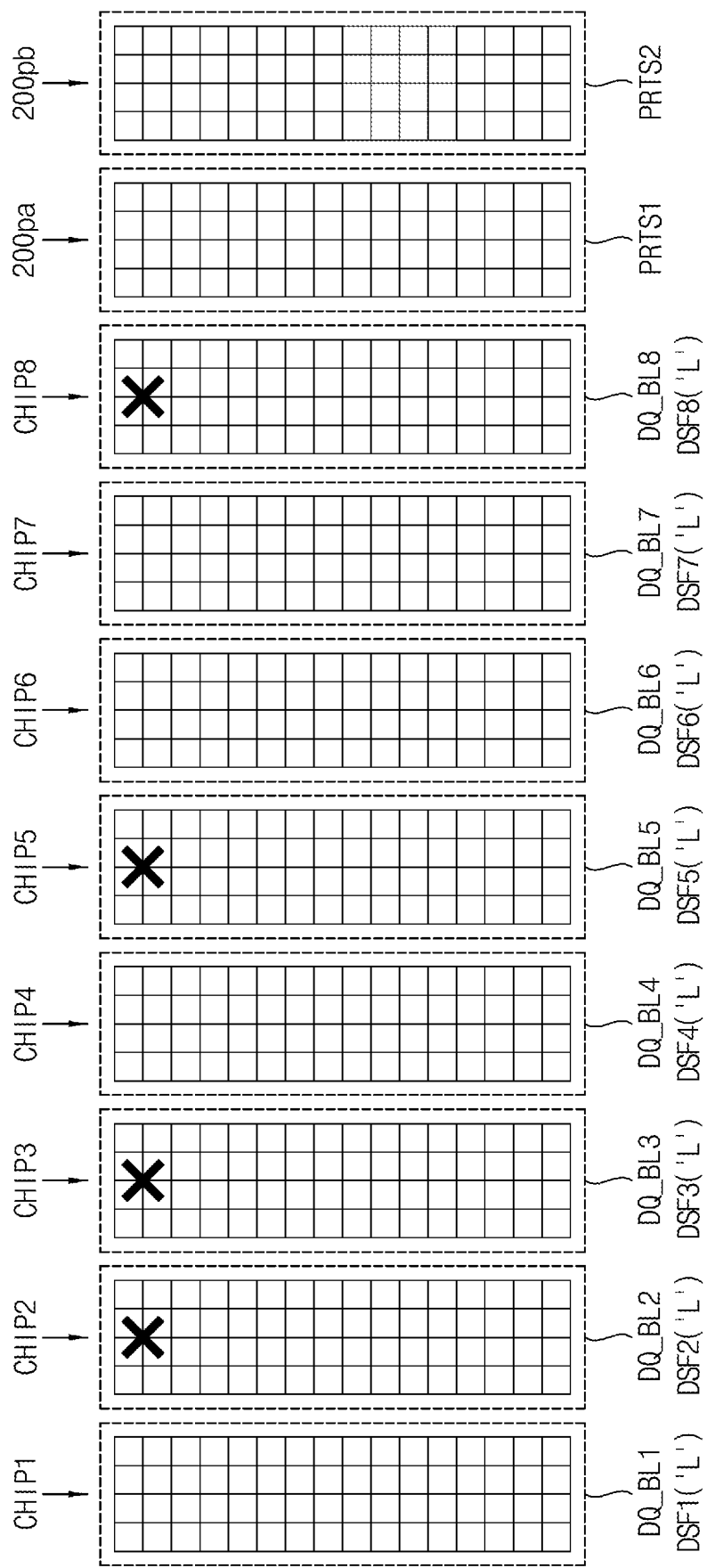
FIGS. 19 through 22 illustrate various types of errors which the ECC decoder may correct according to example embodiments

Referring to FIG. 19, when each of the data sets DQ_BL2, DQ_BL3, DQ_BL5 and DQ_BL8 output from the chips CHIP2, CHIP3, CHIP5 and CHIP8 includes one symbol error, and each of the decoding status flags DSF1~DSF8 has a second logic level (e.g., a logic low level 'L') because the on-die ECC engine in each of the chips CHIP2, CHIP3, CHIP5 and CHIP8 does not detect the symbol error, the codeword set SCW2 that the system ECC engine 130 does not include error symbols and actual codeword set includes four symbol errors. In this case, the erasure number E is zero.

Therefore, the ECC decoder 150 may correct four symbol errors by performing the first ECC decoding on the codeword set SCW2 based on the first parity data PRTS1 and the second parity data PRTS2.

Figure 20:
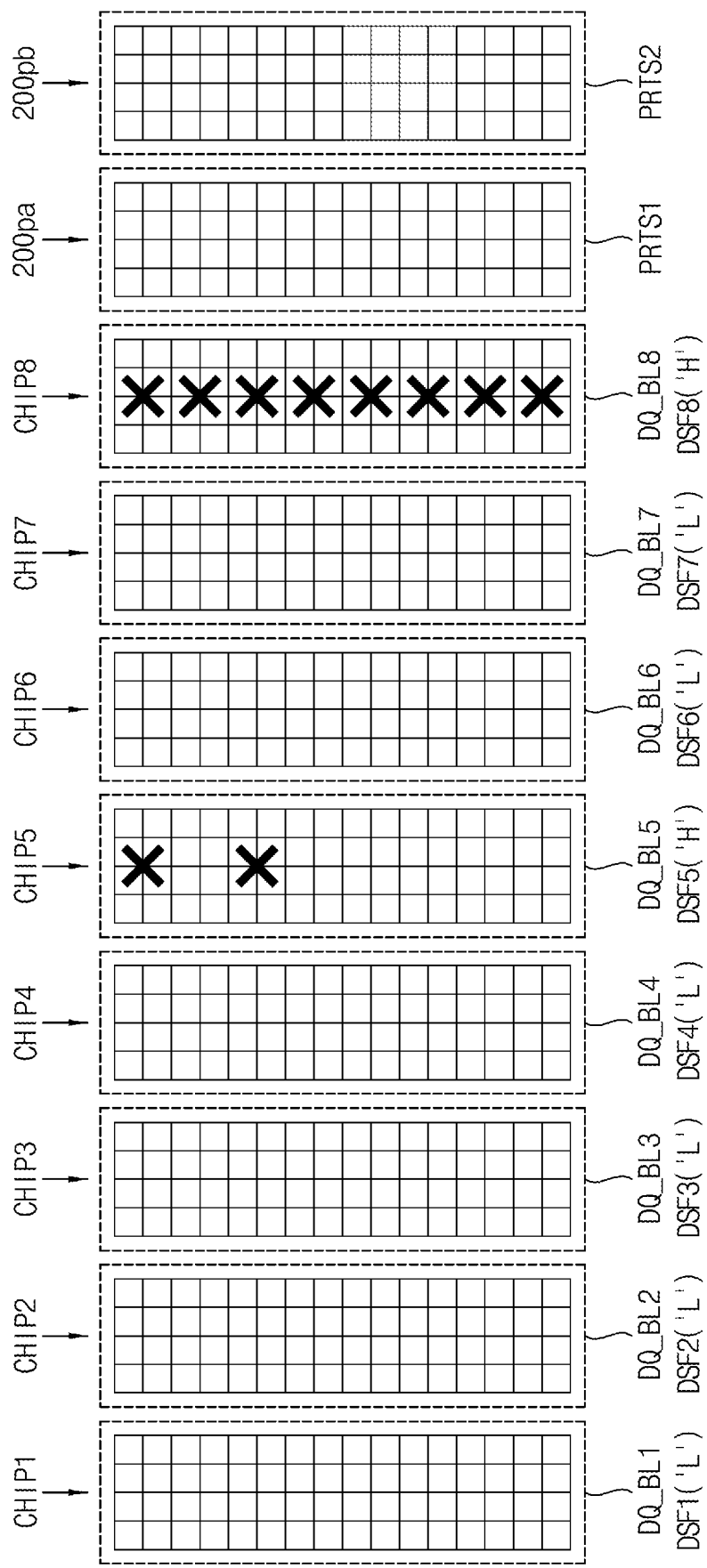

Referring to FIG. 20, when the data set DQ_BL5 output from the chip CHIP5 includes two symbol errors, the data set DQ_BL8 output from the chip CHIP8 includes eight symbol errors, and each of the decoding status flags DSF5 and DSF8 has a first logic level (e.g., a logic low level 'H') because the on-die ECC engine in each of the chips CHIP5 and CHIP8 detects the symbol errors, the codeword set SCW2 that the system ECC engine 130 is considered to include sixteen symbols and actual codeword set includes ten symbol errors. In this case, the erasure number E is sixteen.

The ECC decoder 150 may correct ten symbol errors by performing the second ECC decoding on the codeword set SCW2 based on the first parity data PRTS1 and the second parity data PRTS2.

Figure 21:
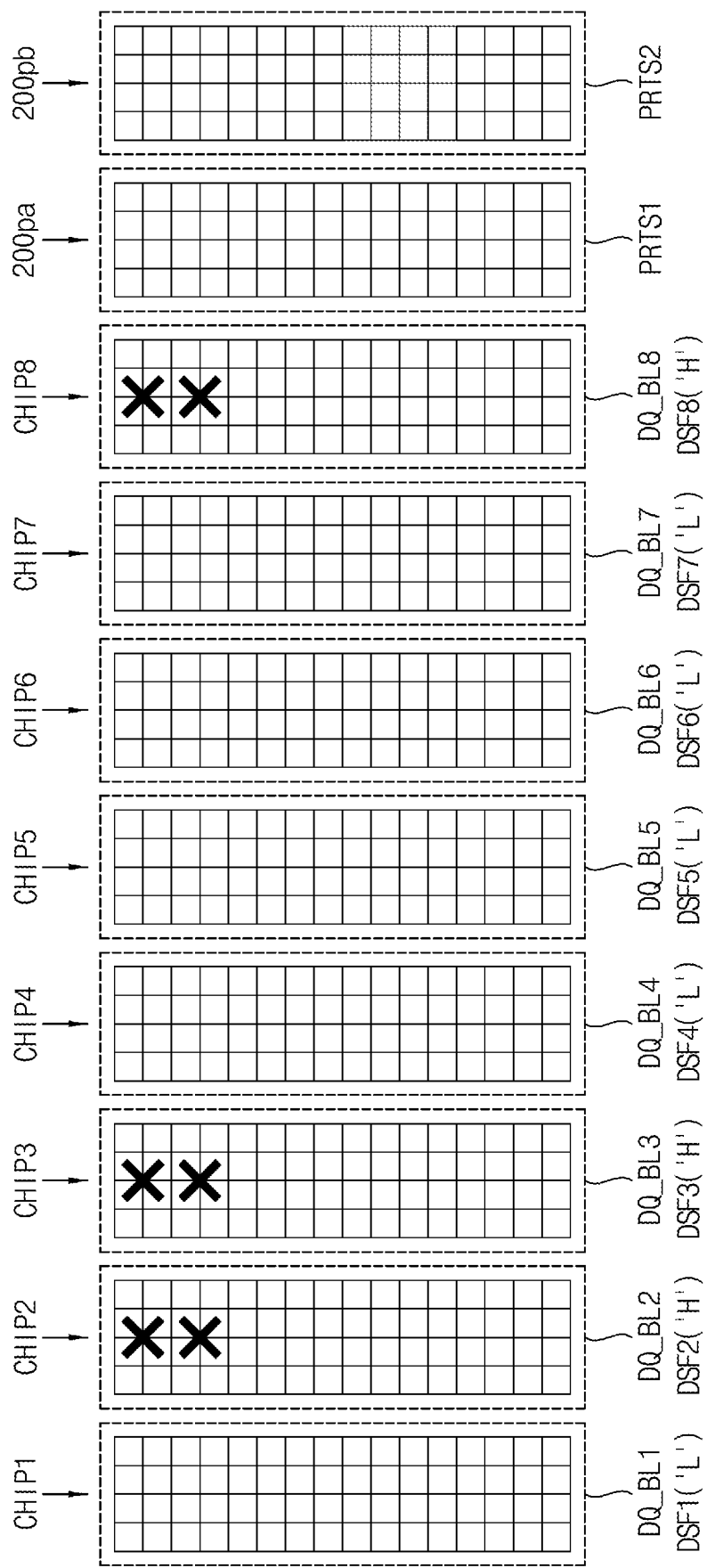

Referring to FIG. 21, when each of the data sets DQ_BL2, DQBL3 and DQ_BL8 output from the chips CHIP2, CHIP3 and CHIP8 includes two symbol errors, and each of the decoding status flags DSF2, DSF3 and DSF8 has a first logic level (e.g., a logic low level 'H') because the on-die ECC engine in each of the chips CHIP2, CHIP3 and CHIP8 detects the symbol errors, the codeword set SCW2 that the system ECC engine 130 is considered to include twenty four symbol errors and actual codeword set includes six symbol errors. In this case, the erasure number E is twenty four.

The ECC decoder 150 may correct six symbol errors by performing the first ECC decoding on the codeword set SCW2 based on the first parity data PRTS1 and the second parity data PRTS2.

Figure 22:
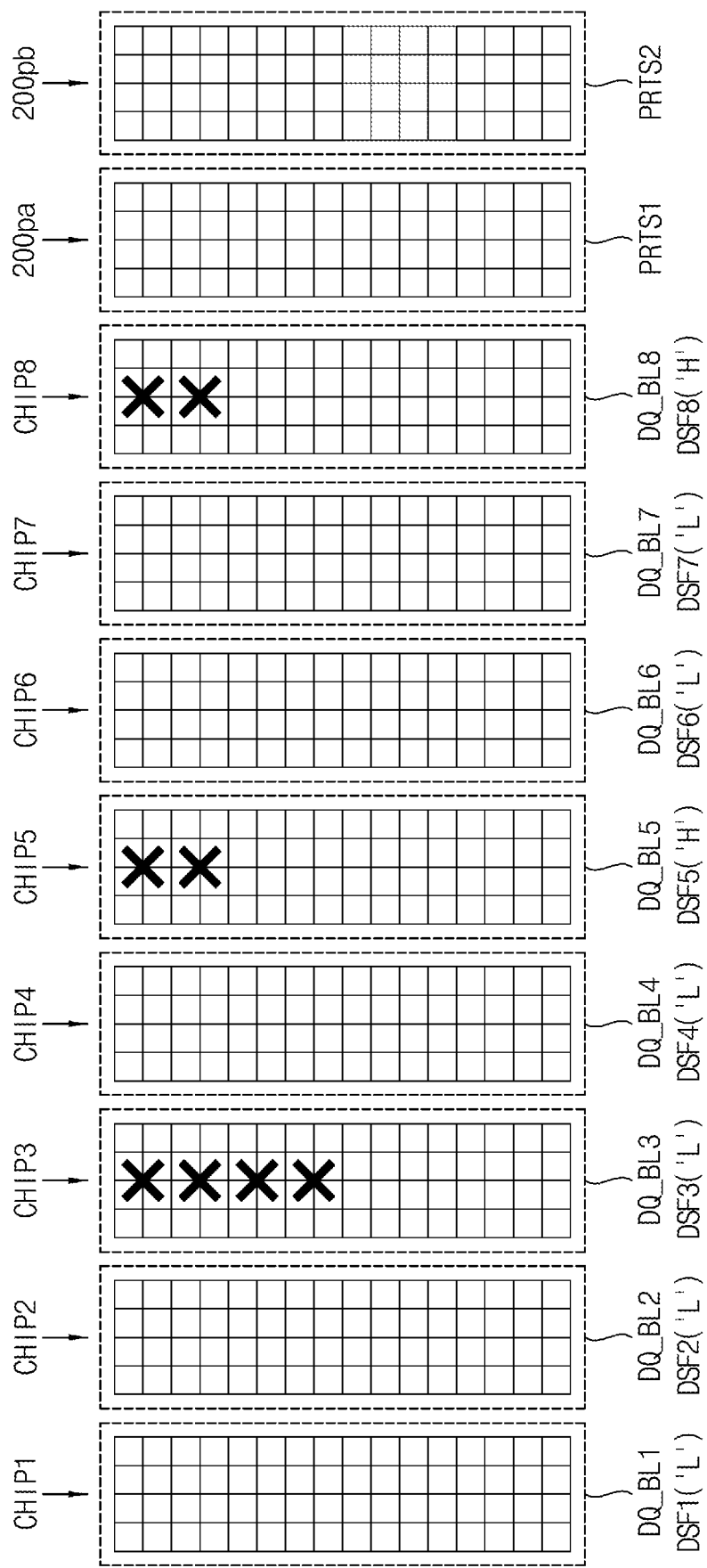

Referring to FIG. 22, when the data set DQ_BL3 output from the chip CHIP3 includes four symbol errors, each of the data sets DQ_BL5 and DQ_BL8 output from the chips CHIP5 and CHIP8 includes two symbol errors, the decoding status flag DSF3 has a second logic level (e.g., a logic low level 'L') because the on-die ECC engine in the chip CHIP3 does not detect the symbol errors, and each of the decoding status flags DSF5 and DSF8 has a first logic level (e.g., a logic low level 'H') because the on-die ECC engine in each of the chips CHIP5 and CHIP8 detects the symbol errors, the codeword set SCW2 that the system ECC engine 130 is considered to include sixteen symbols and actual codeword set includes eight symbol errors. In this case, the erasure number E is sixteen.

The ECC decoder 150 performs the second ECC decoding on the codeword set SCW2 based on the first parity data PRTS1 and the second parity data PRTS2 and the second ECC decoding fails. The ECC decoder 150 may correct eight symbol errors by performing the first ECC decoding on the codeword set SCW2 based on the first parity data PRTS1 and the second parity data PRTS2.

Figure 23:
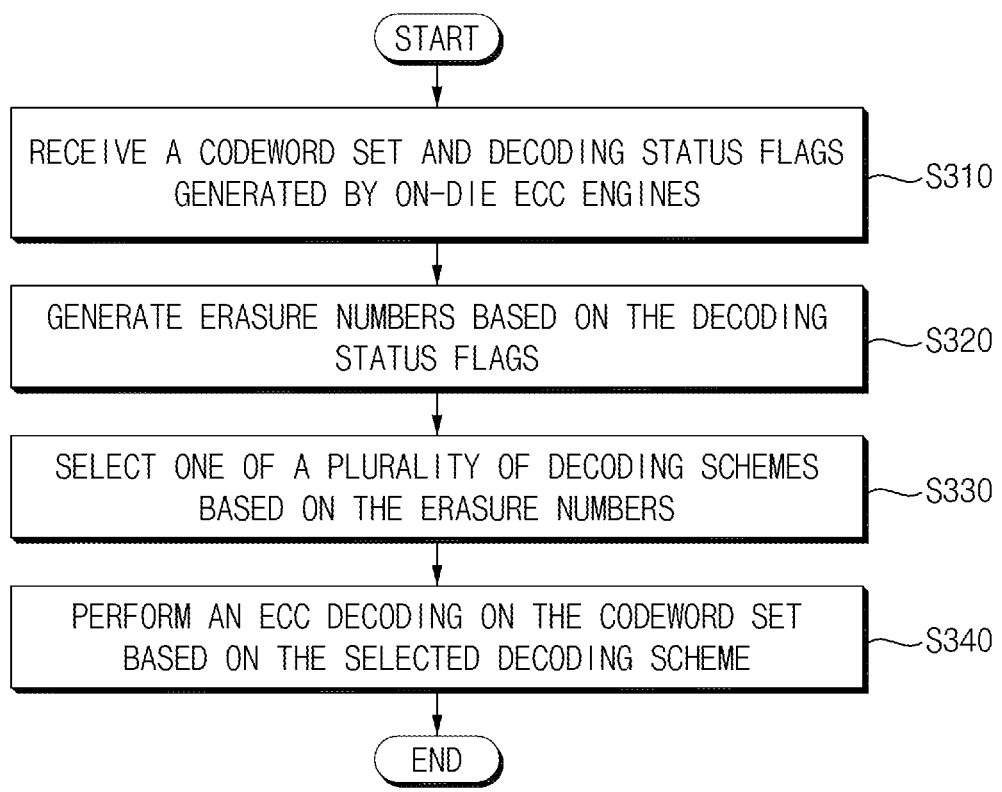
FIG. 23 is a flow chart illustrating a method of correcting errors in a memory controller to control a memory module according to example embodiments.

FIG. 23 is a flow chart illustrating a method of correcting errors in a memory controller to control a memory module according to example embodiments.

Referring to FIGS. 1, 4 and 6 through 23, there is provided a method of correcting errors in a memory controller 100 to control a memory module MM including a plurality of data chips, a first parity chip and a second parity chip. According to the method, the memory controller 100 may receive a codeword set SCW2 including a user data set and a parity data set from the plurality of data chips, the first parity chip and the second parity chip, and decoding status flags DSFs which are generated in on-die ECC engines in the data chips (operation S310). Each of the decoding status flags DSFs indicates whether at least one error bit is detected in respective one of the data chips.

A DSF decoder 185 in the memory controller 100 may generate an erasure number E based on the decoding status flags DSFs (operation S320) and provides an ECC decoder 150 in a system ECC engine 130 with the erasure number E (or, a decision signal DS indicating the erasure number E).

The ECC decoder 150 may select one of a plurality of decoding schemes based on the erasure number E (operation S330 S350), may perform an ECC decoding on the codeword set SCW2 based on the selected decoding scheme (operation S340) and may correct a plurality of symbol errors in the codeword set SCW2.

The plurality of decoding schemes may include a first decoding and a second decoding or may include a first decoding, a second decoding and a third decoding.

The first decoding may correspond to a t-error correction decoding, the second decoding may correspond to a 2t-erasure correction decoding and the third decoding may correspond to an x-error and erasure decoding. Here, t may be a natural number indicating a number of correctable symbol errors by the ECC decoder 150 using the first decoding, 2t indicates a number of correctable symbol errors by the ECC decoder 150 using the second decoding, x indicates a number of correctable symbol errors by the ECC decoder using the third decoding and x may be a natural number greater than t and smaller than 2t.

Therefore, when the erasure number E is greater than zero and equal to or smaller than 2t, the ECC decoder 150 may generate the estimated codeword set by performing a Forney algorithm on the read codeword set SCW2 based on the syndrome SSDR to correct symbol errors in the read codeword set SCW2 without performing a BM algorithm and a CS algorithm of the error location estimator 185, which arouse calculation latency. The ECC decoder 150 may reduce decoding time interval in the second decoding mode.

Figure 24:
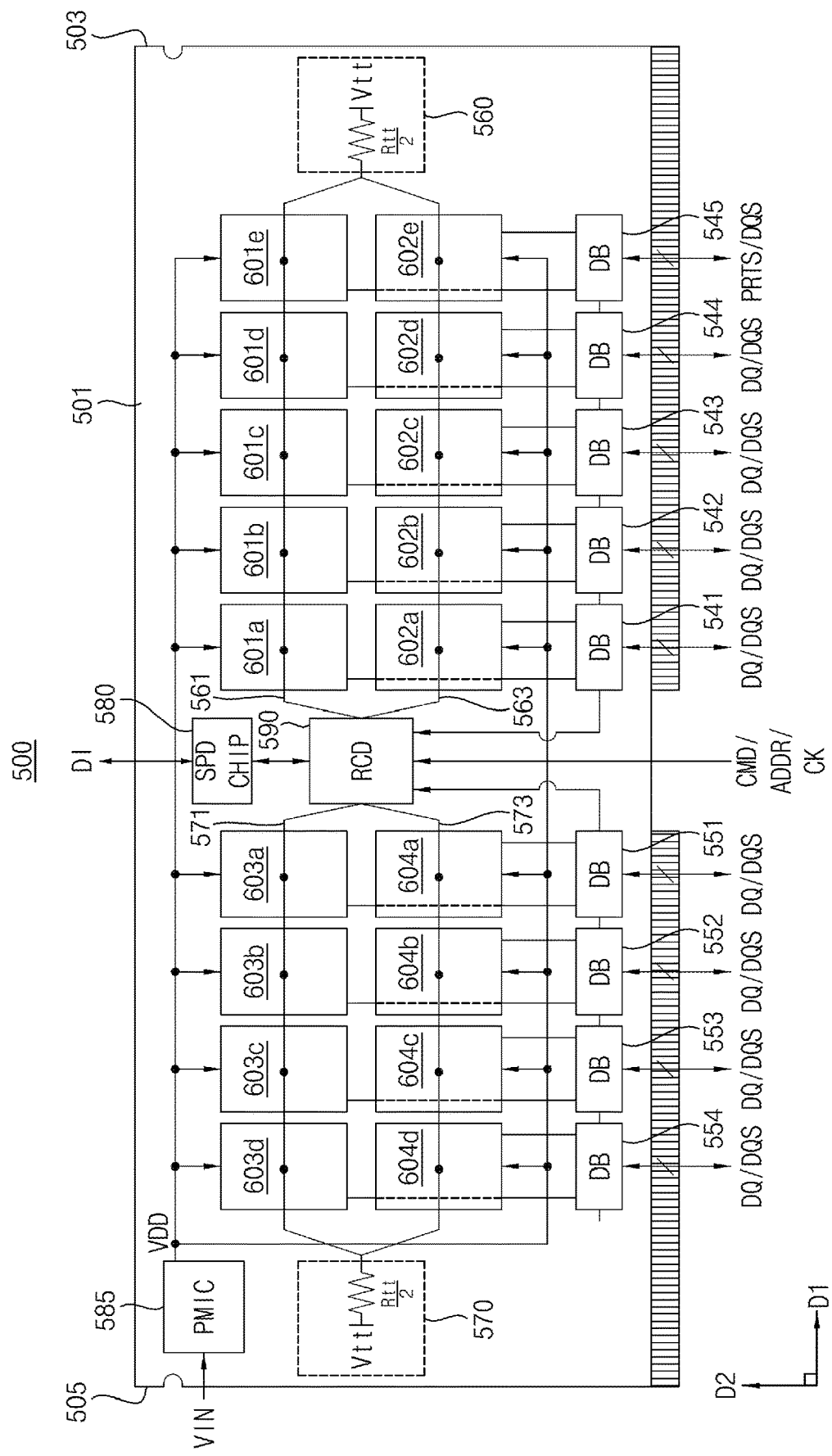
FIG. 24 is a block diagram illustrating a memory module that may be employed by the memory system according to example embodiments.

FIG. 24 is a block diagram illustrating a memory module that may be employed by the memory system according to example embodiments.

Referring to FIG. 24, a memory module 500 may include a registered clock driver (RCD) 590 in or mounted on a circuit board 501, a plurality of semiconductor memory devices 601a~601c, 602a~602c, 603a~603d, and 604a~604d, a plurality of data buffers 541~545 and 551~555, module resistance units 560 and 570, the serial present detect (SPD) chip 580, and a power management integrated circuit (PMIC) 585.

The RCD 590 may control the semiconductor memory devices 601a~601e, 602a~602c, 603a~603d, and 604a~604d and the PMIC 585 under control of the memory controller 100. For example, the RCD 590 may receive an address ADDR, a command CMD, and a clock signal CK from the memory controller 100.

The SPD chip 580 may be a programmable read only memory (e.g., EEPROM). The SPD chip 580 may include initial information or device information DI of the memory module 100. In some example embodiments, the SPD chip 580 may include the initial information or the device information DI such as a module form, a module configuration, a storage capacity, a module type, an execution environment, or the like of the memory module 500.

When a memory system including the memory module 500 is booted up, the memory controller 100 may read the device information DI from the SPD chip 580 and may recognize the memory module 500 based on the device information DI. The memory controller 100 may control the memory module 500 based on the device information DI from the SPD chip 580. For example, the memory controller 100 may recognize a type of the semiconductor memory devices included in the memory module 500 based on the device information DI from the SPD chip 580.

Here, the circuit board 501 which is a printed circuit board may extend in a first direction D1, perpendicular to a second direction D2, between a first edge portion 503 and a second edge portion 505. The first edge portion 503 and the second edge portion 105 may extend in the second direction D2.

The RCD 590 may be at a center of the circuit board 501. The plurality of semiconductor memory devices 601a~601e, 602a~602e, 603a~603d, and 604a~604d may be arranged in a plurality of rows between the RCD 590 and the first edge portion 503 and between the RCD 590 and the second edge portion 505.

In this case, the semiconductor memory devices 601a~601e and 602a~602e may be arranged along a plurality of rows between the RCD 590 and the first edge portion 503. The semiconductor memory devices 603a~603d, and 604a~604d may be arranged along a plurality of rows between the RCD 590 and the second edge portion 505. The semiconductor memory devices 601a~601d, 602a~602d, 603a~603d, and 604a~604d may be referred to data chip and the semiconductor memory devices 601e and 602e may be referred to as first and second parity chips respectively.

Each of the plurality of semiconductor memory devices 601a~601d, 602a~602d, 603a~603d, and 604a~604d may be coupled to a corresponding one of the data buffers 541~544 and 551~554 through a data transmission line for receiving/transmitting data signal DQ and data strobe signal DQS. Each of the semiconductor memory devices 601e and 602e may be coupled to the data buffer 545 through a data transmission line for receiving/transmitting parity data PRTS and the data strobe signal DQS, The RCD 590 may provide a command/address signal (e.g., CA) to the semiconductor memory devices 601a~601e through a command/address transmission line 561 and may provide a command/address signal to the semiconductor memory devices 602a~602e through a command/address transmission line 563.

In addition, the RCD 590 may provide a command/address signal to the semiconductor memory devices 603a~603d through a command/address transmission line 571 and may provide a command/address signal to the semiconductor memory devices 604a~604d through a command/address transmission line 573.

The command/address transmission lines 561 and 563 may be connected in common to the module resistance unit 560 disposed to be adjacent to the first edge portion 503, and the command/address transmission lines 571 and 573 may be connected in common to the module resistance unit 570 disposed to be adjacent to the second edge portion 505.

Each of the module resistance units 560 and 570 may include a termination resistor Rtt/2 connected to a termination voltage Vtt. In this case, an arrangement of the module resistance units 560 and 570 may reduce the number of the module resistance units, thus reducing an area where termination resistors are arranged.

In addition, each of the plurality of semiconductor memory devices 601a~601e, 602a~602c, 603a~603d, and 604a~604d may be a DRAM device.

The SPD chip 580 may be adjacent to the RCD 590 and the PMIC 585 may be between the semiconductor memory device 603d and the second edge portion 505. The PMIC 585 may generate a power supply voltage VDD based on an input voltage VIN and may provide the power supply voltage VDD to the semiconductor memory devices 601a~601e, 602a~602c, 603a~603d, and 604a~604d.

Although it is illustrated as the PMIC 585 is adjacent to the second edge portion 505 in FIG. 24, the PMIC 585 may be in a central portion of the circuit board 501 and may be adjacent to the RCD 590 in some example embodiments.

Figure 25:
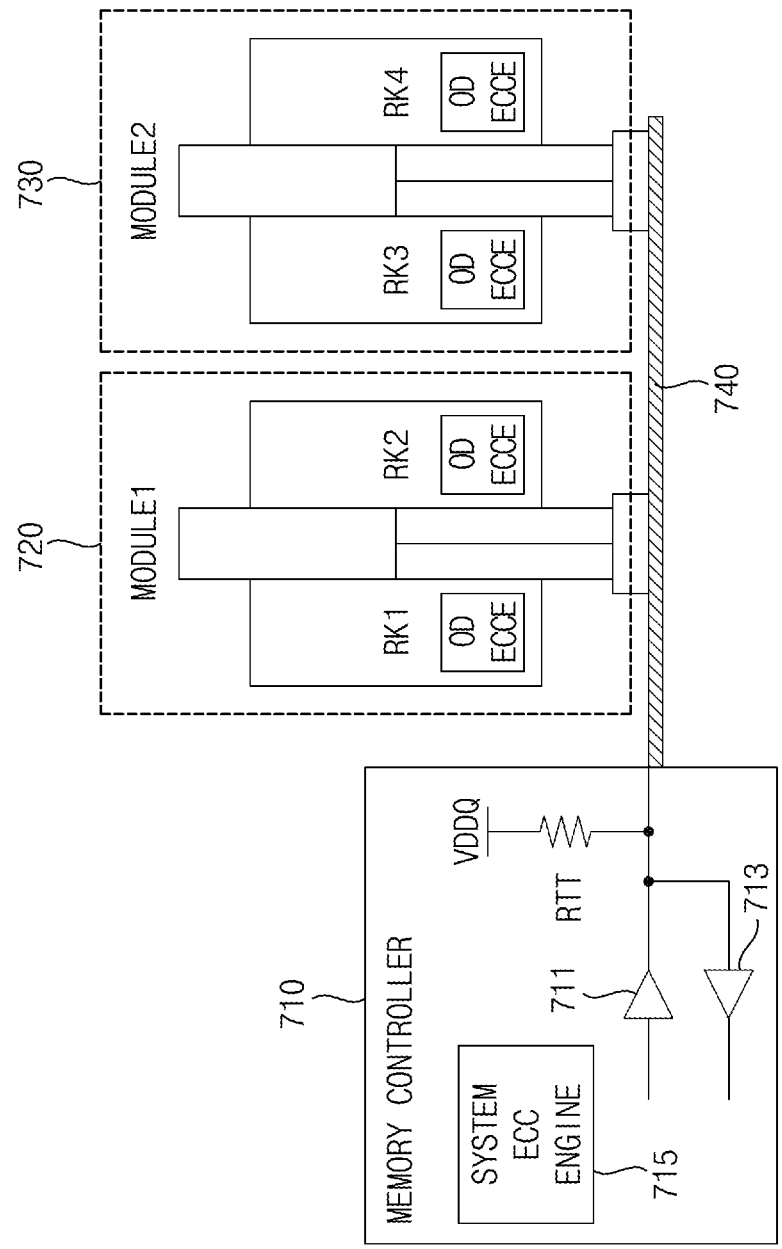
FIG. 25 is a block diagram illustrating a memory system having quad-rank memory modules according to example embodiments.

FIG. 25 is a block diagram illustrating a memory system having quad-rank memory modules according to some example embodiments.

Referring to FIG. 25, a memory system 700 may include a memory controller 710 and at least one or more memory modules 720 and 730.

The memory controller 710 may control a memory module 720 and/or 730 so as to perform a command supplied from a processor or host. The memory controller 710 may be implemented in a processor or host, or may be implemented with an application processor or a system-on-a-chip (SoC). The memory controller 710 may include a transmitter 711 configured to transmit a signal to the at least one or more memory modules 720 and 730, and a receiver 713 configured to receive a signal from the at least one or more memory modules 720 and 730. For signal integrity, a source termination may be implemented with a resistor RTT on a bus 740 of the memory controller 710. The resistor RTT may be coupled to a power supply voltage VDDQ. The memory controller 710 may include a system ECC engine 715 and the system ECC engine 715 may employ the system ECC engine 130 of FIG. 6.

Therefore, the system ECC engine 715 may include an ECC encoder and an ECC decoder. The ECC decoder may determine an erasure number based on decoding status flags received from the one or more memory modules 720 and 730, may select one of a plurality of decoding schemes based on the erasure number, may perform an ECC decoding on a codeword set read from the one or more memory modules 720 and 730 based on the selected decoding scheme and may correct a plurality of symbol errors in the codeword set.

The at least one or more memory modules 720 and 730 may be referred to as a first memory module 720 and a second memory module 730. The first memory module 720 and the second memory module 730 may be coupled to the memory controller 710 through the bus 740. Each of the first memory module 720 and the second memory modules 730 may correspond to the memory module MM in FIG. 1. The first memory module 720 may include at least one or more memory ranks RK1 and RK2, and the second memory module 730 may include one or more memory ranks RK3 and RK4.

Each of the first memory module 720 and the second memory module 730 may include a plurality of data chips, a first parity chip and a second parity chip. Each of the data chips may include an on-die ECC engine OD ECCE that generates a decoding status flag.

Figure 26:
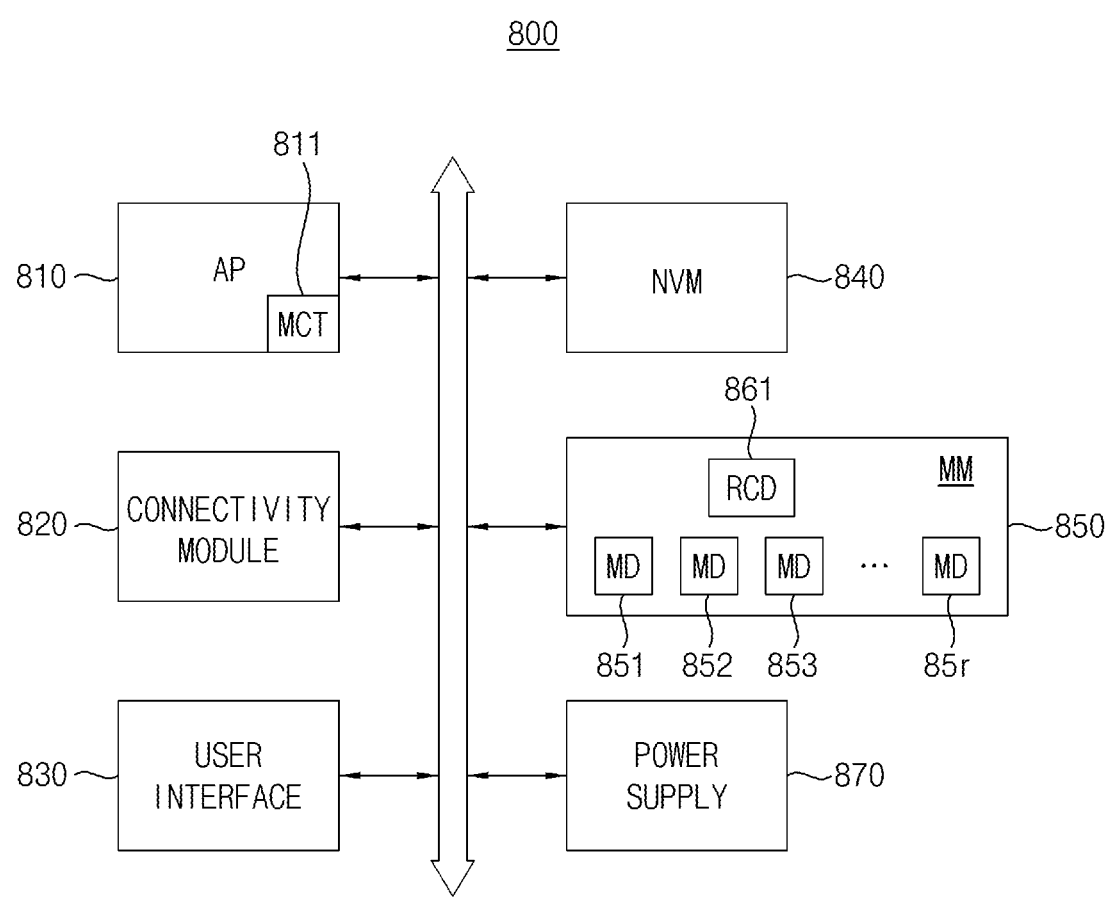
FIG. 26 is a block diagram illustrating a mobile system including a memory module according to example embodiments.

FIG. 26 is a block diagram illustrating a mobile system including a memory module according to some example embodiments.

Referring to FIG. 26, a mobile system 800 may include an application processor 810, a connectivity module 820, a memory module MM 850, a nonvolatile memory device 840, a user interface 830, and a power supply 870. The application processor 810 may include a memory controller (MCT) 811. The memory controller 811 may include the system ECC engine 130 of FIG. 6.

The application processor 810 may execute applications, such as a web browser, a game application, a video player, etc. The connectivity module 820 may perform wired or wireless communication with an external device.

The memory module 850 may store data processed by the application processor 810 or operate as a working memory. The memory module 850 may include a plurality of semiconductor memory devices MD 851, 852, 853, and 85r (where r is a positive integer greater than three), and a RCD 861.

The semiconductor memory devices 851, 852, 853, and 85r may include a plurality of data chips, a first parity chip and a second parity chip. Therefore, the system ECC engine in the memory controller 811 decoder may determine an erasure number based on decoding status flags received from the memory module 850, may select one of a plurality of decoding schemes based on the erasure number, may perform an ECC decoding on a codeword set read from the memory module 850 based on the selected decoding schemes and may correct a plurality of symbol errors in the codeword set.

The nonvolatile memory device 840 may store a boot image for booting the mobile system 800. The user interface 830 may include at least one input device, such as a keypad, a touch screen, etc., and at least one output device, such as a speaker, a display device, etc. The power supply 870 may supply an operating voltage to the mobile system 800.

The mobile system 800 or components of the mobile system 800 may be mounted using various types of packages.

Figure 27:
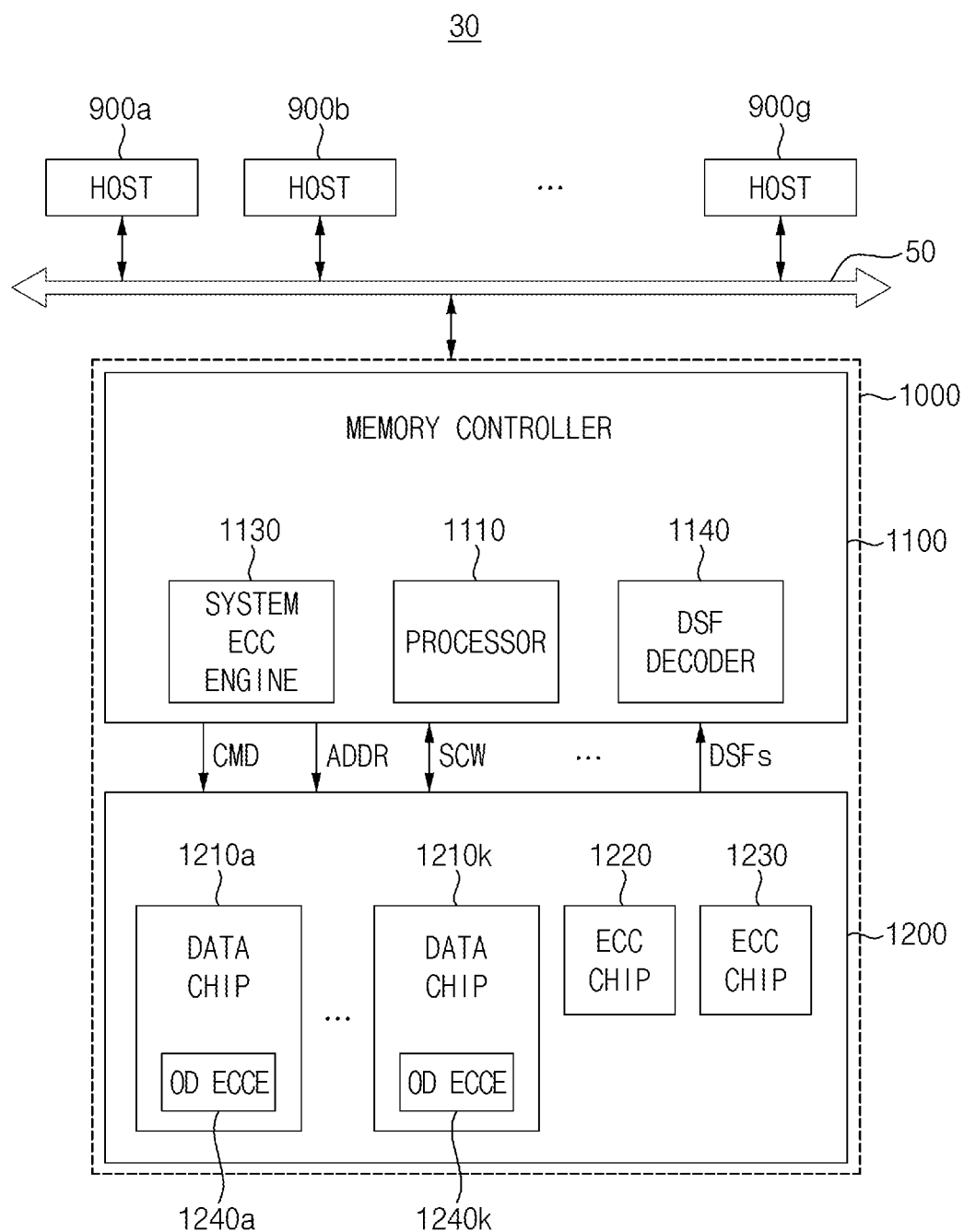
FIG. 27 is a block diagram illustrating a computing system according to example embodiments.

FIG. 27 is a block diagram illustrating a computing system according to some example embodiments.

Referring to FIG. 27, a computing system 30 may include a plurality of hosts 900a, 900b, ..., 900g and a memory system 1000 and the memory system 1000 may include a memory controller 1100 and a memory module 1200. Here, g is a natural number greater than two.

The memory module 1200 may include a plurality of data chips 1210a~1210k, a first parity chip 1220 and a second parity chip 1230. The first parity chip 1220 and the second parity chip 1230 may be referred to as an ECC chip. Each of the data chips 1210a~1210k may include respective one of on-die ECC engines 1240a~1240k.

The memory controller 1100 may apply a command CMD and an address ADDR to the memory module 1200, may exchange a codeword set SCW with the memory module 1200 and may receive decoding status flags DSFs from the memory module 1200.

The memory controller 1100 may include a processor 1110, a system ECC engine 1130 and a DSF decoder 1140.

The processor 1110 may control overall operation of the memory controller 1100.

The system ECC engine 1130 may perform an ECC encoding on a user data set to generate a parity data set and may provide the memory module 1200 with the codeword set SCW including the user data set and the parity data set in a write operation.

The DSF decoder 1140 may receive the decoding status flags DSFs from on-die ECC engines 1240a~1240k in the data chips 1210a~1210k in a read operation. Each of the decoding status flags DSFs may indicate whether at least one error bit is detected in each of the data chips 1210a~1210k. The DSF decoder 1140 may generate a decision signal indicating a number of a decoding status flags having a first logic level, from among the decoding status flags DSFs by decoding the decoding status flags DSF and may provide the decision signal to the system ECC engine 1130.

The system ECC engine 1130 may select one of a plurality of decoding schemes based on the decision signal, may perform an ECC decoding on the codeword set SCW read from the memory modules 1200 based on the selected decoding scheme and a parity check matrix and may correct a plurality of symbol errors in the codeword set SCW.

The memory controller 1100 may be connected to the plurality of hosts 900a, 900b, ..., 900g through a compute express link (CXL) bus 50 and may control the plurality of data chips 1210a~1210k, the first parity chip 1220 and the second parity chip 1230 by communicating the plurality of hosts 900a, 900b, ..., 900g through the CXL interface.

In some embodiments, the CXL bus 50 may support a plurality of CXL protocols and messages and/or data may be transmitted through the plurality of CXL protocols. For example, the plurality of CXL protocols may include a non-coherent protocol (or and I/O protocol CXL.io), a coherent protocol (or a cache protocol CXL.cache), and a memory access protocol (or a memory protocol CXL.memory). In some embodiments, the CXL bus 50 may support protocols such as peripheral component interconnection (PCI), PCI express (PCIe), universal serial bus (USB), and serial advanced technology attachment (SATA). A protocol supported by the CXL bus 50 may referred to as an interconnect protocol.

The memory controller 1100 may refer to a device that provides functions to the plurality of hosts 900a, 900b, ..., 900g. Based on the CXL specification 2.0, the memory controller 1100 may be an accelerator that supports the CXL specification. For example, at least some of computing operations and I/O operations executed in the plurality hosts 900a, 900b, ..., 900g may be off-loaded to the memory controller 1100. In some embodiments, the each of the plurality hosts 900a, 900b, ..., 900g may include any one or any combination of a programmable component (e.g., a graphic processing unit (GPU) and a neural processing unit (NPU), a component (e.g., an intellectual property (IP) core) that provides a fixed function and a reconfigurable component (e.g., a field programmable gate array (FPGA)).

Figure 28:
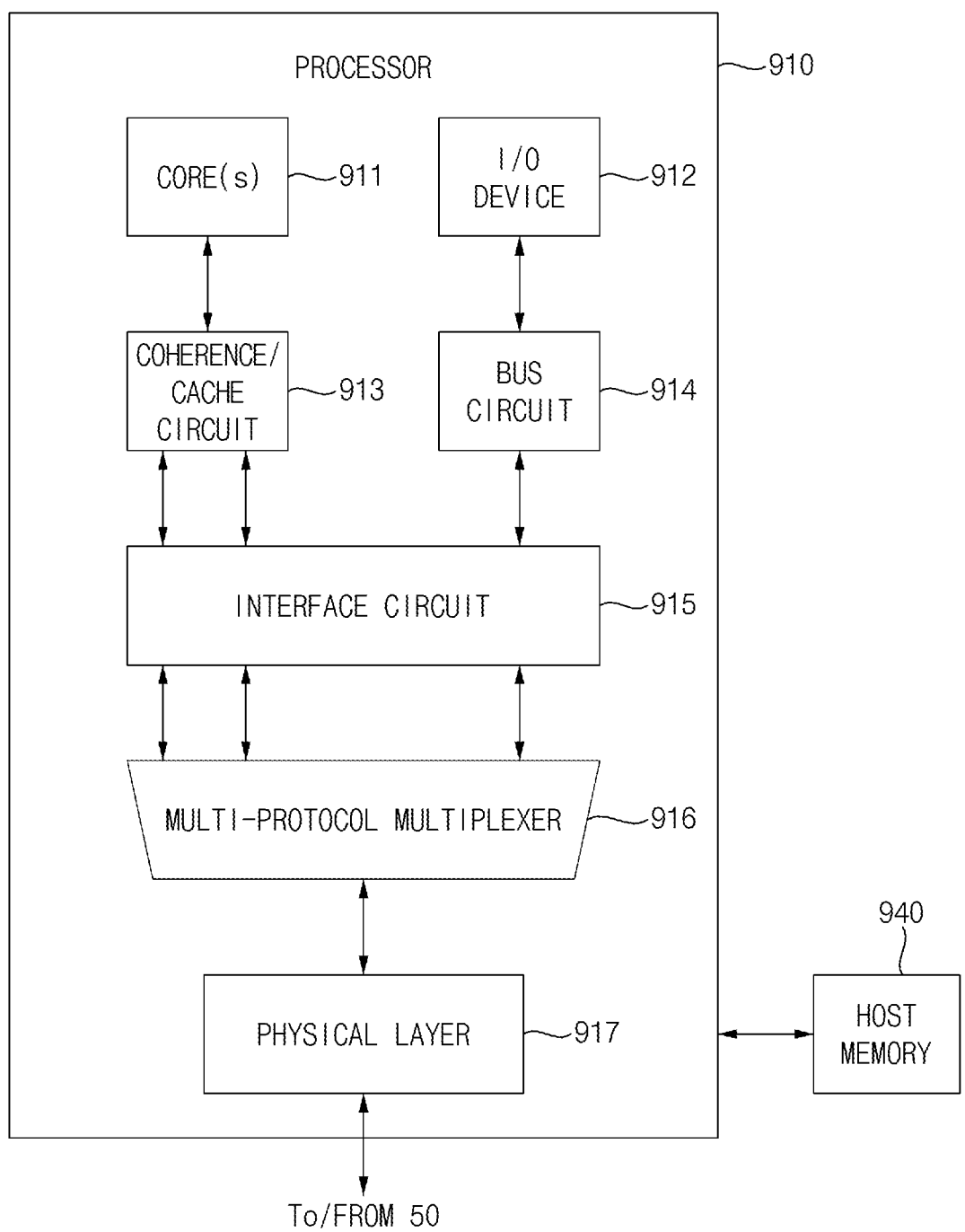
FIG. 28 is a block diagram illustrating one of the plurality hosts in the computing system of FIG. 27 according to example embodiments.

FIG. 28 is a block diagram illustrating one of the plurality hosts in the computing system of FIG. 27 according to some example embodiments.

In FIG. 28, a configuration of the host 900a from among the plurality hosts 900a, 900b, ..., 900g and each configuration of the hosts 900b, ..., 900g may be substantially the same as the configuration of the host 900a.

Referring to FIG. 28, the host 900a may include a processor 910 and a host memory 940.

The processor 910 may be a central processing unit (CPU) of the host 900a. In some embodiments, the processor 910 may be a CXL-based processor. As illustrated in FIG. 28, the processor 910 may be connected to the host memory 940 and may include a physical layer 917, a multi-protocol multiplexer 916, an interface circuit 915, a coherence/cache circuit 913, a bus circuit 914, at least one core 911 and an I/O device 912.

The at least one core 911 may execute an instruction and be connected to the coherence/cache circuit 913. The coherence/cache circuit 913 may include a cache hierarchy and may be referred to as a coherence/cache logic. As illustrated in FIG. 28, the coherence/cache circuit 913 may communicate with the at least one core 911 and interface circuit 915. For example, the coherence/cache circuit 913 may enable communicate through protocols including at least a coherent protocol and a memory access protocol. In some embodiments, the coherence/cache circuit 913 may include a direct memory access (DMA) circuit. The I/O device 912 may be used to communicate with the bus circuit 914. For example, the bus circuit 914 may be a PCIe logic and the I/O device 912 may be a PCIe I/O device.

The interface circuit 915 may enable communication between components (e.g., the coherence/cache circuit 913 and the bus circuit 914) of the processor 910 and the memory system 1000. In some embodiments, the interface circuit 915 may enable communication between components of the processor 910 and the memory system 1000 according to a plurality of protocols (e.g., a non-coherent protocol, the coherent protocol and the memory access protocol). For example, the interface circuit 915 may determine one of the plurality of protocols based on messages and data for communication between the components of the processor 910 and the memory system 1000.

The multi-protocol multiplexer 916 may include at least one protocol queue. The interface circuit 915 may be connected to the at least one protocol queue and transmit and receive messages and/or data to and from the memory system 1000 through the least one protocol queue. In some embodiments, the interface circuit 915 and the multi-protocol multiplexer 916 may be integrally formed into one component. In some embodiments, the multi-protocol multiplexer 916 may include a plurality of protocol queues corresponding respectively to the plurality of protocols supported by the CXL bus 50. In some embodiments, the multi-protocol multiplexer 916 may arbitrate communications of different protocols and provide selected communications the physical layer 917.

Figure 29:
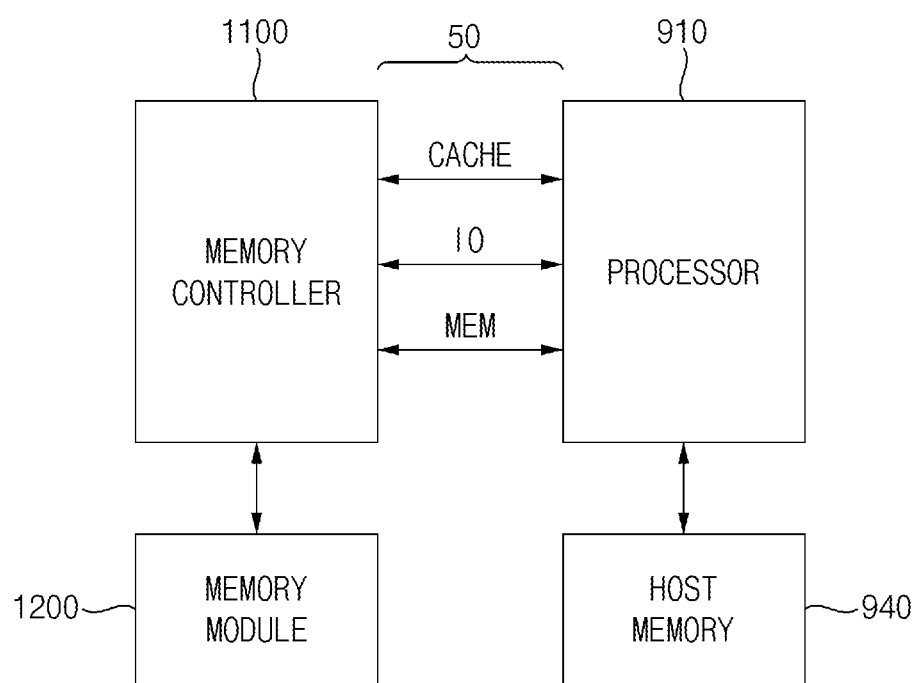
FIG. 29 illustrates an example of a multi-protocol for communication in the computing system of FIG. 27.

FIG. 29 illustrates an example of a multi-protocol for communication in the computing system of FIG. 27.

Referring to FIG. 29, the processor 910 and the memory controller 1100 may communicate with each other based on a plurality of protocols.

According to the above-mentioned CXL examples, the plurality of protocols may include a memory protocol MEM, a coherent protocol CACHE and a non-coherent protocol IO. The memory protocol MEM may define a transaction from a master to a subordinate and a transaction from the subordinate to the master. The coherent protocol CACHE may define interactions between the memory controller 1100 and the processor 910. For example, an interface of the coherent protocol CACHE may include three channels including a request, a response and data. The non-coherent protocol IO may provide a non-coherent load/store for I/O devices.

The memory controller 1100 may communicate with the memory module 1200 and the processor 910 may communicate with the host memory 940.

Figure 30:
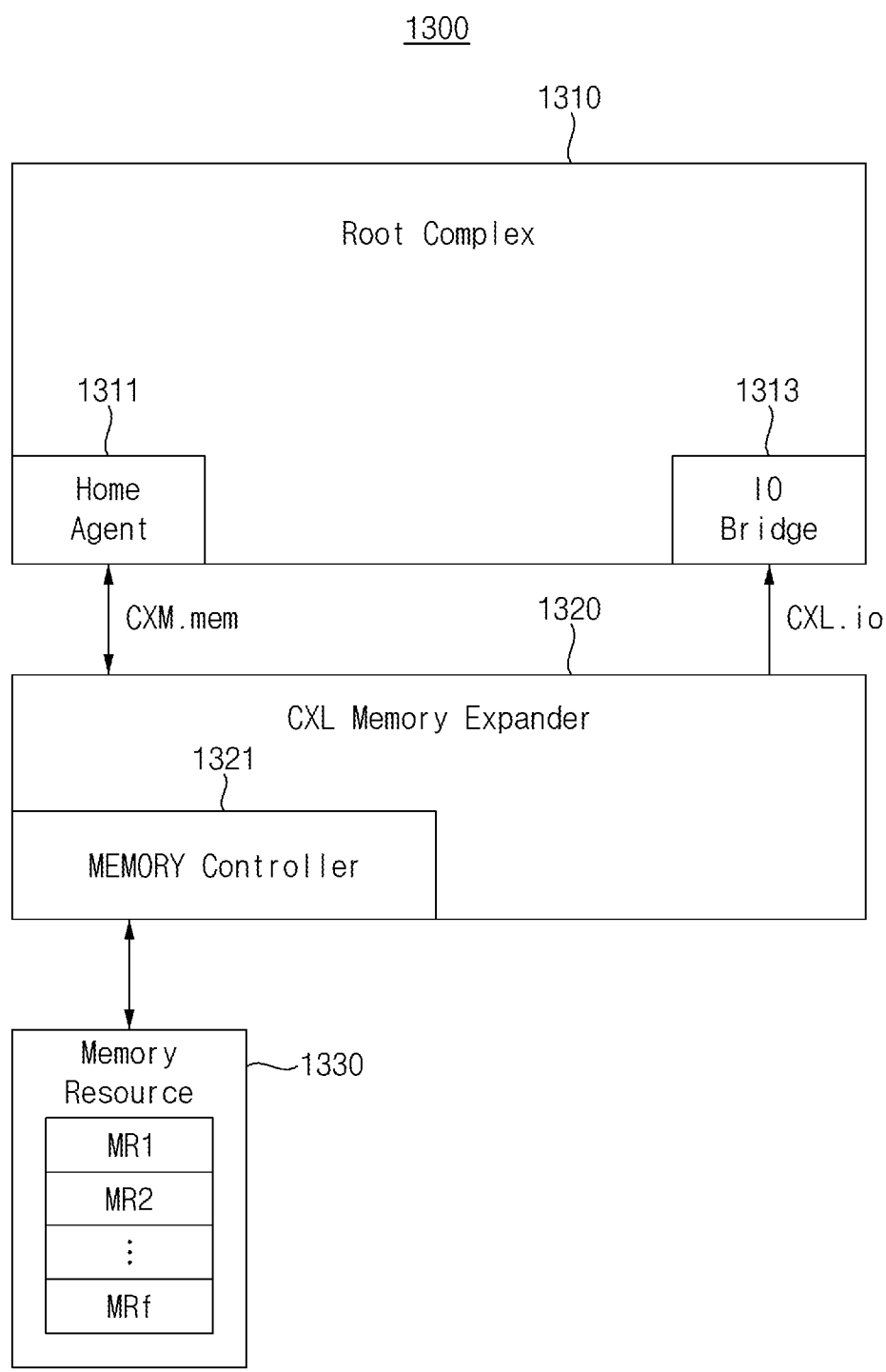
FIG. 30 is an example of a computing system when a memory system according to example embodiments corresponds to a Type 3 memory system defined by a CXL protocol.

FIG. 30 is an example of a computing system when a memory system according to some example embodiments corresponds to a Type 3 memory system defined by a CXL protocol.

Referring to FIG. 30, a computing system 1300 may include a root complex 1310, a CXL memory expander 1320 connected to the root complex 1310 and a memory resource 1330.

The root complex 1310 may include a home agent 1311 and an I/O bridge 1313, and the home agent 1311 may communicate with the CXL memory expander 1320 based on a coherent protocol CXL.mem the I/O bridge 1313 may communicate with the CXL memory expander 1320 based on a non-coherent protocol, e.g., an I/O protocol CXL.io. In a CXL protocol base, the home agent 1311 may correspond to an agent on a host side that is arranged to solve the entire consistency of the computing system 1300 for a given address.

The CXL memory expander 1320 may include a memory controller 1321 (which may be a smart controller) and the memory controller 1321 may employ the memory controller 1100 in FIG. 27.

In addition, the CXL memory expander 1320 may output data to the root complex 1310 via the I/O bridge 1313 based on the I/O protocol CXL.io or the PCIe.

The memory resource 1330 may include a plurality of memory regions MR1, MR2, . . . , MRt and each of the plurality of memory regions MR1, MR2, . . . , MRt may be implemented as a memory of a various units.

Figure 31:
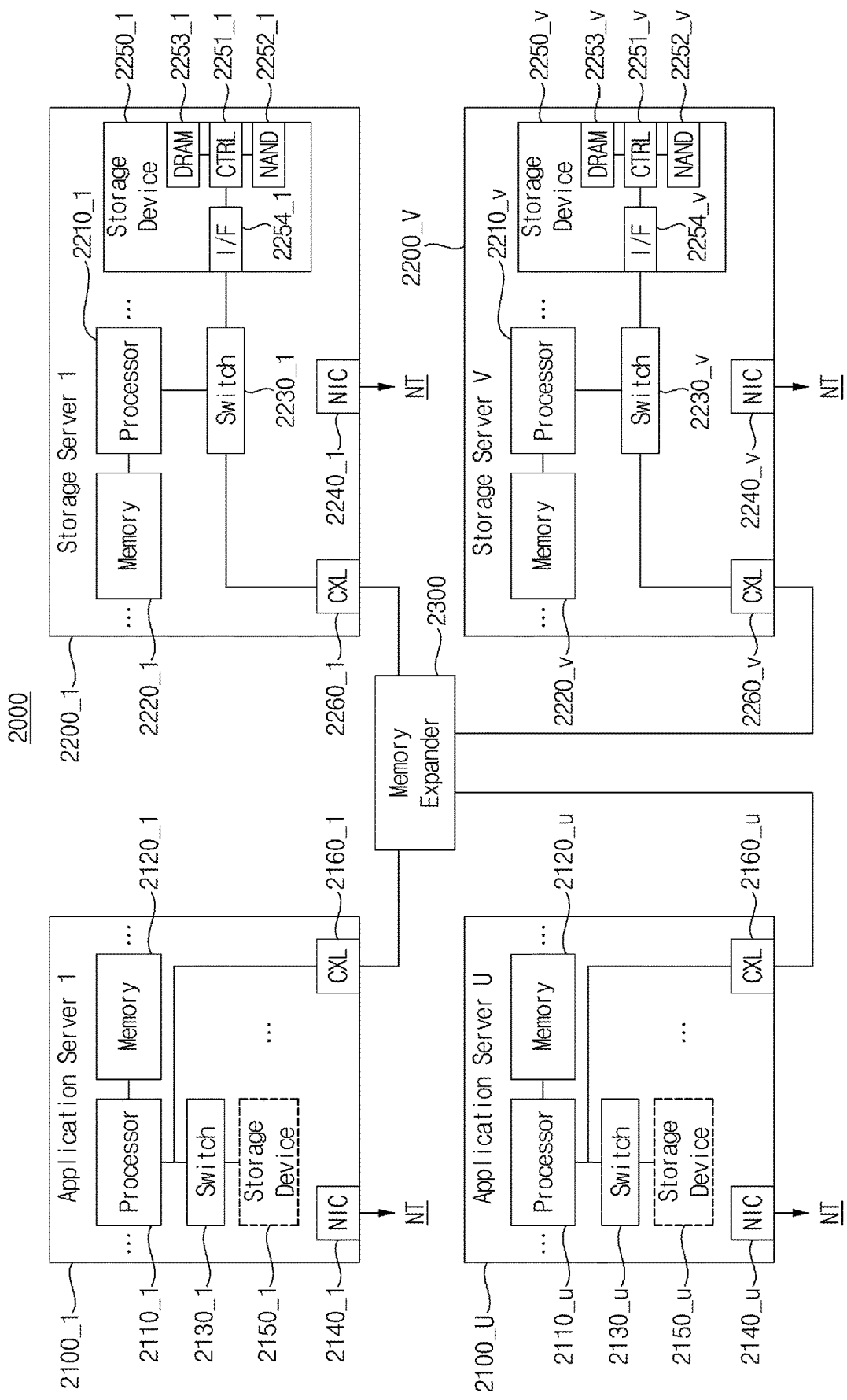
FIG. 31 is a block diagram illustrating a data center including a computing system according to example embodiments.

FIG. 31 is a block diagram illustrating a data center including a computing system according to some example embodiments.

Referring to FIG. 31, a data center 2000 may be a facility that collects various types of data and provides various services, and may be referred to as a data storage center. The data center 2000 may be a system for operating search engines and databases, and may be a computing system used by companies such as banks or government agencies. The data center 2000 may include application servers 2100_1 to 2100_U and storage servers 2200_1 to 2200_V. The number of the application servers 2100_1 to 2100_U and the number of the storage servers 2200_1 to 2200_V may be variously selected according to some example embodiments, and the number of the application servers 2100_1 to 2100_U and the number of the storage servers 2200_1 to 2200_V m may be different from each other.

Below, for convenience of description, an example of the storage server 2200_1 will be described.

The storage server 2200_1 may include a processor 2210_1, a memory 2220_1, a switch 2230_1, a network interface controller (NIC) 2240_1, a storage device 2250_1 and CXL interface 2260_1. The storage server 2200_V may include a processor 2210_v, a memory 2220_v, a switch 2230_v, a NIC 2240_v, a storage device 2250_v and CXL interface 2260_v.

The processor 2210_1 may control overall operation of the storage server 2200_1. The memory 2220_1 may store various instructions or data under control of the processor 2210_1. The processor 2210_1 may be configured to access the memory 2220_1 to execute various instructions or to process data. In some embodiments, the memory 2220_1 may include at least one of various kind of memory devices such as double data rate synchronous DRAM (DDR SDRAM), high bandwidth memory (HBM), hybrid memory cube (HMC), dual in-line memory module (DIMM), Optane DIMM or non-volatile DIMM.

In some embodiments, the number of the processors 2210_1 included in the storage server 2200_1 and the number of the memories 2220_1 included in the storage server 2200_1 may be variously changed or modified. In an embodiment, the processor 2210_1 and the memory 2220_1 included in the storage server 2200_1 may constitute a processor-memory pair and the number of processor-memory pairs included in the storage server 2200_1 maybe variously changed or modified. In some embodiments, the number of the processors 2210_1 included in the storage server 2200_1 and the number of the memories 2220_1 included in the storage server 2200_1 may be different. The processor 2210_1 may include a single core processor and a multi-core processor.

Under control of the processor 2210_1, the switch 2230_1 may selectively connect the processor 2210_1 and the storage device 2250_1 or may selectively connect the NIC 2240-1, the storage device 2250_1 and the CXL interface 2260_1.

The NIC 2240_1 may connect the storage server 2200_1 with a network NT. The NIC 2240_1 may include a network interface card, a network adapter, and the like. The NIC 2240_1 may be connected to the network NT through a wired interface, a wireless interface, a Bluetooth interface, or an optical interface. The NIC 2240_1 may include an internal memory, a digital signal processor (DSP), a host bus interface, and the like and may be connected with the processor 2210_1 or the switch 2230_1 through the host bus interface. The host bus interface may include at least one of various interface schemes such as an advanced technology attachment (ATA), a serial ATA (SATA) an external SATA (e-SATA), a small computer system interface (SCSI), a serial attached SCSI (SAS), a peripheral component interconnection (PCI), a PCI express (PCIe), an NVMe, a compute express link (CXL), an IEEE 1394, a universal serial bus (USB), a secure digital (SD) card interface, a multimedia card (MMC) interface, an embedded MMC (eMMC) interface, a universal flash storage (UFS) interface, an embedded UFS (eUFS) interface, a compact flash (CF) card interface, etc. In an embodiment, the NIC 2240_1 may be integrated with at least one of the processor 2210_1, the switch 2230_1 and the storage device 2250_1.

Under control of the processor 2210_1, the storage device 2250_1 may store data or may output the stored data. The storage device 2250_1 may include a controller CTRL 2251_1, a nonvolatile memory NAND 2252_1, a DRAM 2253_1 and an interface (I/F) 2254_1. In some embodiments, the storage device 2250_1 may further include a secure element SE for security or privacy. The storage device 2250_v may include a controller CTRL 2251_v, a nonvolatile memory NAND 2252_v, a DRAM 2253_v and an interface I/F 2254_v. In some embodiments, the storage device 2250_v may further include a secure element SE for security or privacy.

The controller 2251_1 may control overall operation of the storage device 2250_1. The controller 2251_1 may include an SRAM. In response to signals received through the I/F 2254_1, the controller 2251_1 may store data in the nonvolatile memory 2252_1 or may output data stored in the nonvolatile memory 2252_1. The controller 2251_1 may be configured to control the nonvolatile memory 2252_1 based on a toggle interface or an ONFI.

The DRAM 2253_1 may be configured to temporarily store data to be stored in the nonvolatile memory 2252_1 or data read from the nonvolatile memory 2252_1. The DRAM 2253_1 may be configured to store various data (e.g., metadata and mapping data) necessary of the controller 2251_1 to operate. The I/F 2254_1 may provide a physical connection between the controller 2251_1 and the processor 2210_1, the switch 2230_1 or the NIC 2240_1. The I/F 2254_1 may be implemented to support direct-attached storage (DAS) manner that allows the direct connection of the storage device 2250_1 through a dedicated cable. The I/F 2254_1 may be implemented based on at least one of various above-described interfaces through a host interface bus.

The above components of the storage server 2200_1 are provided as an example, and the present disclosure is not limited thereto. The above components of the storage server 2200_1 may be applied to each of the other storage servers or each of the application servers 2100_1 to 2100_U. In each of the application servers 2100_1 to 2100_U, a storage device 2150_1 may be selectively omitted.

The application server 2100_1 may include a processor 2110_1, a memory 2120_1, a switch 2130_1, a NIC 2140_1, and CXL interface 2160_1. The application server 2100_U may include a processor 2110_u, a memory 2120_u, a switch 2130_u, a NIC 2140_1, and CXL interface 2160_u.

The application servers 2100_1 to 2100_U and the storage servers 2200_1 to 2200_V may communicate with each other through the network NT. The network NT may be implemented using a fiber channel (FC) or an Ethernet. The FC may be a medium used for a relatively high speed data transmission, and an optical switch that provides high performance and/or high availability may be used. The storage servers 2200_1 to 2200_V may be provided as file storages, block storages or object storages according to an access scheme of the network 3300.

In some example embodiments, the network NT may be a storage-only network or a network dedicated to a storage such as a storage area network (SAN). For example, the SAN may be an FC-SAN that uses an FC network and is implemented according to an FC protocol (FCP). For another example, the SAN may be an IP-SAN that uses a transmission control protocol/internet protocol (TCP/IP) network and is implemented according to an iSCSI (a SCSI over TCP/IP or an Internet SCSI) protocol. In other example embodiments, the network NT may be a general network such as the TCP/IP network. For example, the network NT may be implemented according to at least one of protocols such as an FC over Ethernet (FCOE), a network attached storage (NAS), a nonvolatile memory express (NVMe) over Fabrics (NVMe-oF), etc.

In some example embodiments, at least one of the plurality of application servers 2100_1 to 2100_U may be configured to access at least one of the remaining application servers or at least one of the storage servers 2200_1 to 2200_V over the network NT.

For example, the application server 2100_1 may store data requested by a user or a client in at least one of the storage servers 2200_1 to 2200_V over the network NT. Alternatively, the application server 2100_1 may obtain data requested by s user or a client in at least one of the storage servers 2200_1 to 2200_V over the network NT. In this case, the application server 2100_1 may be implemented with a web server, a database management system (DBMS), or the like.

The application server 2100_1 may access a memory 2120_1 or a storage device 2105_1 of the application server 2100_1 or the storage device 2250_1 of the storage server 2000_1 over the network NT. As such, the application server 2100_1 may perform various operations on data stored in the application servers 2100_1 to 2100_U and/or the storage servers 2200_1 to 2200_V. For example, the application server 2100_1 may execute a command for moving or copying data between the application servers 2100_1 to 2100_U and/or the storage servers 2200_1 to 2200_V. The data may be transferred from the storage devices 2250_1 to 2250_v of the storage servers 2200_1 to 2200_V to the memories 2120_1 to 2120_u of the application servers 2100_1 to 2100_U directly or through the memories 2220_1 to 2220_v of the storage servers 2200_1 to 2200_V. For example, the data transferred through the network NT may be encrypted data for security or privacy.

The storage servers 2200_1 to 2200_V and the application servers 2100_1 to 2100_U may be connected with a memory expander 2300 through the CXL interfaces 2260_1 to 2260_v and 2160_1 to 2160_u. The memory expander 2300 may be used as expanded memory of each of the storage servers 2200_1 to 2200_V and the application servers 2100_1 to 2100_U or virtualized component included therein may communicate with each other through the CXL interfaces 2260_1 to 2260_v and 2160_1 to 2160_u and the memory expander 2300.

The present disclosure may be applied to various electronic devices and systems that include memory modules and memory systems. For example, the present disclosure may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IOT) device, an internet of everything (IoE) device, an e-book reader, a virtual reality (VR) device, an augmented reality (AR) device, a robotic device, a drone, etc.

While the present disclosure has been particularly shown and described with reference to some example embodiments thereof, it will be understood by those of ordinary skill in the art that various changes in form and detail may be made therein without departing from the scope of the present disclosure as defined by the following claims.

What is claimed is:

1. A memory controller configured to control a memory module including a plurality of data chips, a first parity chip and a second parity chip, the memory controller comprising:
   a system error correction code (ECC) engine; and
   a processor configured to control the system ECC engine, wherein the system ECC engine includes an ECC decoder and a memory configured to store a parity check matrix, wherein the ECC decoder is configured to:
receive a read codeword set from the memory module;
select one of a plurality of ECC decoding schemes based on decoding status flags that are provided from the plurality of data chips and are different from the read codeword set, wherein each of the decoding status flags indicates whether at least one error bit is detected in a respective one of the plurality of data chips; and
correct a plurality of symbol errors in the read codeword set by performing an ECC decoding on the read codeword set based on the selected decoding scheme and the parity check matrix,
wherein the plurality of ECC decoding schemes include a first decoding and a second decoding, and
wherein, in response to the decoding status flags indicating that no error bits are detected in the plurality of data chips and a syndrome based on the read codeword set and the parity check matrix being non-zero, the ECC decoder is configured to perform the first decoding on the read codeword set.

2. The memory controller of claim 1,
wherein the first decoding corresponds to a t-error correction decoding,
wherein the second decoding corresponds to a 2t-erasure correction decoding,
wherein t is a natural number indicating a number of correctable symbol errors by the ECC decoder using the first decoding, and
wherein 2t indicates a number of correctable symbol errors by the ECC decoder using the second decoding.

3. The memory controller of claim 1, wherein the ECC decoder is configured to generate a first estimated codeword set by performing the first decoding on the read codeword set, and
wherein, in response to the decoding status flags indicating that no error bits are detected in the plurality of data chips and the syndrome being zero, the ECC decoder is configured to determine that the read codeword set includes no symbol errors.

4. The memory controller of claim 3, wherein the ECC decoder is configured to:
generate an error position signal by generating coefficients of an error locator polynomial by performing a Berlekamp-Massey algorithm on the syndrome and by searching an error position by performing a Chien search algorithm based on the coefficients;
perform a Forney algorithm on the read codeword set based on the error position signal to generate the first estimated codeword set;
generate a final syndrome based on the first estimated codeword set and the parity check matrix;
determine that there has been a successful decoding in response to the final syndrome being zero; and
determine that there are uncorrectable errors in response to the final syndrome being non-zero.

5. The memory controller of claim 2, wherein the ECC decoder is configured to determine whether an erasure number corresponding to a number of the decoding status flags having a first logic level is greater than zero,
wherein, in response to the erasure number being greater than zero and being equal to or smaller than 2t, the ECC decoder is configured to generate a first estimated codeword set by performing the second decoding on the read codeword set, and
wherein the ECC decoder is configured to perform a Forney algorithm on the read codeword set to generate the first estimated codeword set.

6. The memory controller of claim 5, wherein the ECC decoder is configured to:
generate a final syndrome based on the first estimated codeword set and the parity check matrix;
determine that there has been a successful decoding in response to the final syndrome being zero; and
generate a second estimated codeword set by performing the first decoding on the read codeword set in response to the final syndrome being non-zero.

7. The memory controller of claim 2, wherein the ECC decoder is configured to determine whether an erasure number corresponding to a number of the decoding status flags having a first logic level is greater than zero,
wherein, in response to the erasure number being greater than 2t, the ECC decoder is configured to generate an estimated codeword set by performing the first decoding on the read codeword set.

8. The memory controller of claim 7, wherein the ECC decoder is configured to:
generate a final syndrome based on the estimated codeword set and the parity check matrix;
determine that there has been a successful decoding in response to the final syndrome being zero; and
determine that there are uncorrectable errors in response to the final syndrome being non-zero.

9. The memory controller of claim 1,
wherein the plurality of ECC decoding schemes further include a third decoding,
wherein the first decoding corresponds to a t-error correction decoding,
wherein the second decoding corresponds to a 2t-erasure correction decoding,
wherein the third decoding corresponds to an x-error and erasure decoding,
wherein t is a natural number indicating a number correctable symbol errors by the ECC decoder using the first decoding,
wherein 2t indicates a number of correctable symbol errors by the ECC decoder using the second decoding,
wherein x indicates a number of correctable symbol errors by the ECC decoder using the third decoding, and
wherein x is a natural number greater than t and smaller than 2t.

10. The memory controller of claim 9, wherein the ECC decoder is configured to:
determine whether an erasure number corresponding to a number of the decoding status flags having a first logic level is greater than zero;
generate a first estimated codeword set by performing the second decoding on the read codeword set in response to the erasure number being greater than zero and being equal to or smaller than 2t;
generate a first final syndrome based on the first estimated codeword set and the parity check matrix; and
generate a second estimated codeword set by performing the third decoding on the read codeword set in response to the first final syndrome being non-zero and the erasure number being smaller than or equal to 2t−2.

11. The memory controller of claim 10, wherein the ECC decoder is configured to:
generate a second final syndrome based on the second estimated codeword set and the parity check matrix;
determine that there has been a successful decoding in response to the second final syndrome being zero; and
generate a third estimated codeword set by performing the first decoding on the read codeword set in response to the second final syndrome being non-zero.

12. The memory controller of claim 11, wherein the ECC decoder is configured to:
generate a third final syndrome based on the third estimated codeword set and the parity check matrix;
determine that there has been a successful decoding in response to the third final syndrome being zero; and
determine that there are uncorrectable errors in response to the third final syndrome being non-zero.

13. The memory controller of claim 1, wherein the ECC decoder comprises:
a first syndrome calculator configured to generate the syndrome by performing a matrix-multiplication operation on the read codeword set and the parity check matrix;
a first sub decoder configured to generate a first estimated codeword set by correcting the symbol errors in the read codeword set based on the syndrome in response to an erasure number corresponding to a number of the decoding status flags having a first logic level being greater than zero and being equal to or smaller than 2t;
a second sub decoder configured to generate a second estimated codeword set by generating coefficients of an error locator polynomial based on the syndrome, by generating an error position signal based on the coefficients, and by correcting the symbol errors in the read codeword set based on the error position signal, in response to the erasure number being zero; and
a demultiplexer configured to provide the syndrome to one of the first sub decoder or the second sub decoder based on a decision signal indicating the erasure number, and
wherein t is a natural number indicating correctable symbol errors by the ECC decoder using the first decoding, and
wherein 2t is a natural number indicating correctable symbol errors by the ECC decoder using the second decoding.

14. The memory controller of claim 13, further comprising a decoding status flag decoder,
wherein the decoding status flag decoder is configured to:
receive the decoding status flags;
generate the decision signal by decoding the decoding status flags; and
provide the decision signal to the ECC decoder,
wherein the first sub decoder is configured to:
generate a first final syndrome by performing the matrix-multiplication operation on the first estimated codeword set and the parity check matrix; and
provide the first estimated codeword set to the second sub decoder in response to syndrome values of the first final syndrome being non-zero,
wherein the second sub decoder includes a buffer configured to:
store the second estimated codeword set; and
output one of the second estimated codeword set or an uncorrectable error signal based on a second final syndrome generated based on the parity check matrix and the second estimated codeword set.

15. The memory controller of claim 1, wherein:
the read codeword set includes a user data set, a first parity data and a second parity data;
the user data set is read from the plurality of data chips;
the first parity data is read from the first parity chip; and
the second parity data is read from the second parity chip,
wherein the parity check matrix is generated based on Reed-Solomon code and the parity check matrix includes:
a first sub check matrix that corresponds to the user data set and the first parity data; and
a second sub check matrix that corresponds to the user data set and the second parity data, and
wherein the ECC decoder is configured to generate the syndrome based on first sub check matrix and the second sub check matrix.

16. A memory system comprising:
a memory module that includes a plurality of data chips, a first parity chip and a second parity chip, wherein each of the plurality of data chips includes an on-die error correction code (ECC) engine; and
a memory controller configured to control the memory module, wherein the memory controller includes:
a decoding status flag decoder configured to receive decoding status flags generated by the plurality of on-die ECC engines, from the memory module, and generate a decision signal indicating an erasure number corresponding to a number of the decoding status flags having a first logic level by decoding the decoding status flags, each of the decoding status flags indicating whether at least one error bit is detected in a respective one of the plurality of data chips; and
an ECC decoder configured to select one of a plurality of ECC decoding schemes based on the decision signal generated by the decoding status flag decoder, and correct a plurality of symbol errors in a read codeword set from the memory module by performing an ECC decoding on the read codeword set based on the selected decoding scheme and a parity check matrix,
wherein the decoding status flags are different from the read codeword set,
wherein the plurality of ECC decoding schemes include a first decoding and a second decoding, and
wherein, in response to the decoding status flags indicating that no error bits are detected in the plurality of data chips and a syndrome based on the read codeword set and the parity check matrix being non-zero, the ECC decoder is configured to perform the first decoding on the read codeword set.

17. The memory system of claim 16, wherein each of the plurality of on-die ECC engines comprises:
a syndrome generator configured to generate a sub syndrome based on a read data and a sub parity;
an error locator configured to generate an error position signal indicating a position of an error bit in the read data by decoding the sub syndrome; and
a decoding status flag generator configured to generate a corresponding decoding status flag of the decoding status flags based on the sub syndrome and the error position signal, the corresponding decoding status flag indicating whether the error bit is detected in the read data.

18. The memory system of claim 16,
wherein the ECC decoder is configured to select one of the plurality of ECC decoding schemes based on the erasure number,
wherein the first decoding corresponds to a t-error correction decoding,
wherein the second decoding corresponds to a 2t-error erasure decoding,
wherein t is a natural number indicating correctable symbol errors by the ECC decoder using the first decoding, wherein 2t is a natural number indicating correctable symbol errors by the ECC decoder using the second decoding, wherein the ECC decoder is configured to generate an estimated codeword set by performing the first decoding on the read codeword set, and wherein, in response to the erasure number being greater than zero and being equal to or smaller than 2t, the ECC decoder is configured to generate an estimated codeword set by performing the second decoding on the read codeword set.

19. The memory system of claim 16, wherein the ECC decoder is configured to select one of the plurality of ECC decoding schemes based on the erasure number, wherein the plurality of ECC decoding schemes further include a third decoding, wherein the first decoding corresponds to a t-error correction decoding, wherein the second decoding corresponds to a 2t-error erasure decoding, wherein the third decoding corresponds to an x-error and erasure decoding, wherein t is a natural number indicating correctable symbol errors by the ECC decoder using the first decoding, wherein 2t indicates correctable symbol errors by the ECC decoder using the second decoding, wherein x indicates correctable symbol errors by the ECC decoder using the third decoding, wherein x is a natural number greater than t and smaller than 2t, and wherein the ECC decoder is configured to:

generate a first estimated codeword set by performing the second decoding on the read codeword set in response to the erasure number being greater than zero and being equal to or smaller than 2t;

generate a first final syndrome based on the first estimated codeword set and the parity check matrix; and generate a second estimated syndrome by performing the third decoding on the read codeword set in response to the first final syndrome being non-zero and the erasure number being smaller than or equal to 2t−2.

20. A memory controller configured to control a memory module including a plurality of data chips, a first parity chip and a second parity chip, each of the plurality of data chips including an on-die error correction code (ECC) engine, the memory controller configured to control the memory module by communicating with one or more host through a compute express link (CXL) interface, the memory controller comprising:

a decoding status flag decoder configured to receive decoding status flags generated by the plurality of on-die ECC engines, from the memory module, and generate a decision signal indicating an erasure number corresponding to a number of the decoding status flags having a first logic level by decoding the decoding status flags, each of the decoding status flags indicating whether at least one error bit is detected in a respective one of the plurality of data chips; and an ECC decoder configured to select one of a plurality of ECC decoding schemes based on the decision signal, and correct a plurality of symbol errors in a read codeword set from the memory module by performing an ECC decoding on the read codeword set based on the selected decoding scheme and a parity check matrix, wherein, in response to the erasure number being zero and a syndrome based on the read codeword set and the parity check matrix being non-zero, the ECC decoder is configured to generate an estimated codeword set by performing ECC decoding on the read codeword set, and wherein, in response to the erasure number being zero and the syndrome being zero, the ECC decoder is configured to determine that the read codeword set includes no symbol errors.

* * * * *